(12) United States Patent
Jung et al.

(10) Patent No.: US 11,527,524 B2
(45) Date of Patent: Dec. 13, 2022

(54) SEMICONDUCTOR DEVICE

(71) Applicant: Samsung Electronics Co., Ltd., Suwon-si (KR)

(72) Inventors: Uidam Jung, Suwon-si (KR); Youngbum Woo, Hwaseong-si (KR); Byungkyu Kim, Seoul (KR); Eunji Kim, Seoul (KR); Seungwoo Paek, Yongin-si (KR)

(73) Assignee: Samsung Electronics Co., Ltd.

( * ) Notice: Subject to any disclaimer, the term of this patent is extended or adjusted under 35 U.S.C. 154(b) by 125 days.

(21) Appl. No.: 17/030,887

(22) Filed: Sep. 24, 2020

(65) Prior Publication Data
US 2021/0202458 A1     Jul. 1, 2021

(30) Foreign Application Priority Data
Dec. 26, 2019 (KR) .................. 10-2019-0175041

(51) Int. Cl.
*H01L 25/18*  (2006.01)
*H01L 27/11565*  (2017.01)
*H01L 27/11582*  (2017.01)
*H01L 23/00*  (2006.01)

(52) U.S. Cl.
CPC .............. *H01L 25/18* (2013.01); *H01L 24/05* (2013.01); *H01L 24/08* (2013.01); *H01L 24/29* (2013.01); *H01L 24/32* (2013.01); *H01L 27/11565* (2013.01); *H01L 27/11582* (2013.01); *H01L 2224/0557* (2013.01); *H01L 2224/08145* (2013.01); *H01L 2224/29186* (2013.01);

(Continued)

(58) Field of Classification Search
CPC ..... H01L 25/0657; H01L 25/18; H01L 24/08; H01L 27/11565
See application file for complete search history.

(56) References Cited

U.S. PATENT DOCUMENTS 10,062,707 B2   8/2018   Lee
10,134,752 B2   11/2018  Kim et al.
10,147,732 B1   12/2018  Hu et al.
(Continued)

FOREIGN PATENT DOCUMENTS

CN       109686739 A    4/2019
KR       20190054470 A  5/2019

*Primary Examiner* — Dale E Page
*Assistant Examiner* — Wilner Jean Baptiste
(74) *Attorney, Agent, or Firm* — Myers Bigel, P.A.

(57) ABSTRACT

A semiconductor device includes an insulating structure; a plurality of horizontal layers vertically stacked and spaced apart from each other in the insulating structure; a conductive material pattern contacting the insulating structure; and a vertical structure penetrating through the plurality of horizontal layers and extending into the conductive material pattern in the insulating structure. Each of the plurality of horizontal layers comprises a conductive material, the vertical structure comprises a vertical portion and a protruding portion, the vertical portion of the vertical structure penetrates through the plurality of horizontal layers, the protruding portion of the vertical structure extends from the vertical portion into the conductive material pattern, a width of the vertical portion is greater than a width of the protruding portion, and a side surface of the protruding portion is in contact with the conductive material pattern.

12 Claims, 23 Drawing Sheets

(52) U.S. Cl.
CPC .............. *H01L 2224/32145* (2013.01); *H01L 2924/1431* (2013.01); *H01L 2924/14511* (2013.01)

(56) References Cited

U.S. PATENT DOCUMENTS

| | | |
|---|---|---|
| 10,403,634 B2 | 9/2019 | Hwang et al. |
| 10,930,661 B2 * | 2/2021 | Chen ................. H01L 27/11573 |
| 10,985,142 B2 * | 4/2021 | Xiao ....................... H01L 24/08 |
| 2019/0081069 A1 | 3/2019 | Lu et al. |
| 2019/0148399 A1 | 5/2019 | Jung et al. |
| 2019/0296041 A1 | 9/2019 | Yamasaka et al. |

\* cited by examiner

SEMICONDUCTOR DEVICE

CROSS-REFERENCE TO RELATED APPLICATION(S)

This application claims benefit of priority to Korean Patent Application No. 10-2019-0175041 filed on Dec. 26, 2019 in the Korean Intellectual Property Office, the disclosure of which is incorporated herein by reference in its entirety.

FIELD

The present inventive concept relates to a semiconductor device and related fabrication methods.

BACKGROUND

As semiconductor devices become smaller and require higher capacity data processing, it may be necessary to increase a degree of integration of elements constituting such semiconductor devices. As one such method for improving the degree of integration of the elements, semiconductor devices having vertical transistor structures, instead of planar transistor structures, have been proposed.

SUMMARY

An aspect of the present inventive concept is to provide a semiconductor device capable of improving a degree of integration.

According to an aspect of the present inventive concept, a semiconductor device is provided. The semiconductor device includes a first chip structure; and a second chip structure, bonded to the first chip structure. The first chip structure includes a semiconductor substrate; a first insulating structure on the semiconductor substrate; a peripheral circuit in the first insulating structure; and first junction pads in the first insulating structure. The second chip structure includes a second insulating structure; a conductive material pattern on the second insulating structure; a plurality of horizontal layers vertically stacked and spaced apart from each other in the second insulating structure; a vertical structure penetrating through the plurality of horizontal layers and extending into the conductive material pattern in the second insulating structure; and second junction pads in the second insulating structure. The first insulating structure and the second insulating structure are in contact with each other, the first junction pads and the second junction pads are in contact with each other, the vertical structure comprises a vertical portion and a protruding portion, extending from the vertical portion, the vertical portion of the vertical structure penetrates through the plurality of horizontal layers, the protruding portion of the vertical structure extends from the vertical portion into the conductive material pattern, the vertical structure includes a channel layer extending from the vertical portion to the protruding portion, and a side surface of the channel layer in the protruding portion is in contact with the conductive material pattern.

According to an aspect of the present inventive concept, a semiconductor device is provided. The semiconductor device includes an insulating structure; a plurality of horizontal layers vertically stacked and spaced apart from each other in the insulating structure; a conductive material pattern contacting the insulating structure; and a vertical structure penetrating through the plurality of horizontal layers and extending into the conductive material pattern in the insulating structure. Each of the plurality of horizontal layers includes a conductive material, the vertical structure includes a vertical portion and a protruding portion, the vertical portion of the vertical structure penetrates through the plurality of horizontal layers, the protruding portion of the vertical structure extends from the vertical portion into the conductive material pattern, in the vertical structure, a width of the vertical portion is greater than a width of the protruding portion, and a side surface of the protruding portion is in contact with the conductive material pattern.

According to an aspect of the present inventive concept, a semiconductor device is provided. The semiconductor device includes a substrate; a first insulating structure on the substrate; first junction pads having respective upper surfaces coplanar with an upper surface of the first insulating structure; a second insulating structure on the first insulating structure; second junction pads having respective lower surfaces coplanar with a lower surface of the second insulating structure in the second insulating structure; a plurality of horizontal layers vertically stacked and spaced apart from each other in the second insulating structure; a conductive material pattern on the second insulating structure; and a vertical structure penetrating through the plurality of horizontal layers and extending into the conductive material pattern in the second insulating structure. The first insulating structure and the second insulating structure are in contact with each other, the first junction pads and the second junction pads are in contact with each other, the vertical structure includes a vertical portion and a protruding portion having a width narrower than a width of the vertical portion, the vertical portion of the vertical structure penetrates through the plurality of horizontal layers, the protruding portion of the vertical structure extends from the vertical portion into the conductive material pattern, and a side surface of the protruding portion is in contact with the conductive material pattern.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
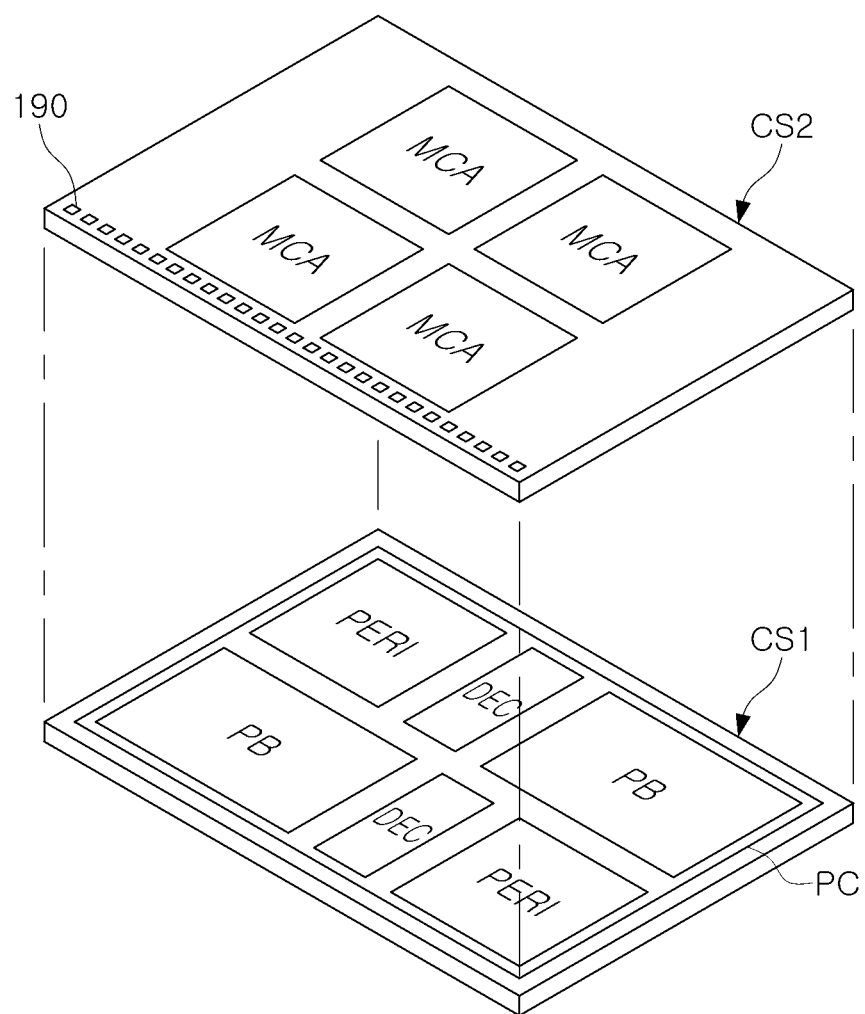
FIG. 1 is a schematic exploded perspective view illustrating a semiconductor device according to an embodiment of the present inventive concept.

Hereinafter, examples of the present inventive concept will be described with reference to the accompanying drawings.

Hereinafter, it can be understood that terms such as 'on,' 'an upper portion,' 'an upper surface,' 'below,' 'a lower portion,' 'a lower surface,' 'a side surface,' and the like are denoted by reference numerals and are referred to the drawings, unless otherwise indicated. When an element or layer is 'directly on' another element or layer, no intervening elements or layers are present.

FIG. 1 is a schematic exploded perspective view illustrating a semiconductor device according to an embodiment of the present inventive concept.

Referring to FIG. 1, a semiconductor device 1 according to an embodiment may include a first chip structure CS1 and a second chip structure CS2. The terms 'first,' 'second,' etc. are used herein merely to distinguish one element from another. The first chip structure CS1 and the second chip structure CS2 may be joined and bonded to each other.

The first chip structure CS1 may include a peripheral circuit PC, and the second chip structure CS2 may include a memory cell array region MCA. The memory cell array region MCA may be provided as a plurality of memory cell array regions MCA.

The peripheral circuit PC may include a row decoder DEC, a page buffer PB, and other circuit PERI. The other circuit PERI may include a latch circuit, a cache circuit, a sense amplifier, an input/output buffer, an electrostatic discharge (ESD) element, or a data input/output circuit.

The row decoder DEC, the page buffer PB, and the other circuit PERI in the peripheral circuit PC may be arranged in various forms.

The second chip structure CS2 may include a plurality of input/output pads 190. The plurality of input/output pads 190 may be arranged on at least one side of the second chip structure CS2. For example, the plurality of input/output pads 190 may be arranged in rows along at least one edge of the second chip structure CS2. An arrangement of the plurality of input/output pads 190 in the second chip structure CS2 is not limited to the arrangement illustrated in FIG. 1, and may be variously modified.

In an example, the first chip structure CS1 may be referred to as a logic chip structure, and the second chip structure CS2 may be referred to as a memory chip structure.

Figure 2:
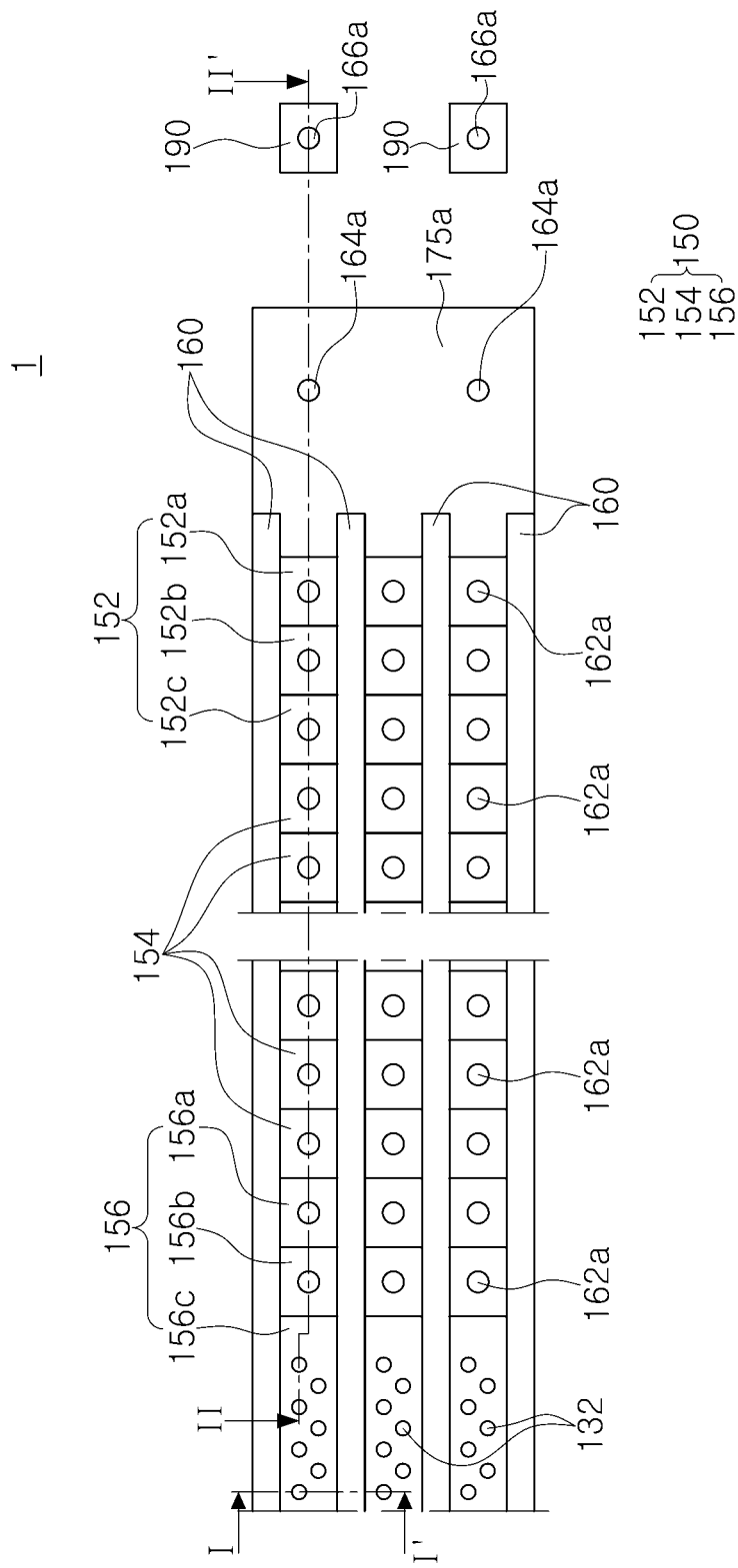
FIG. 2 is a plan view schematically illustrating some components of a semiconductor device according to an embodiment of the present inventive concept.
Figure 3:
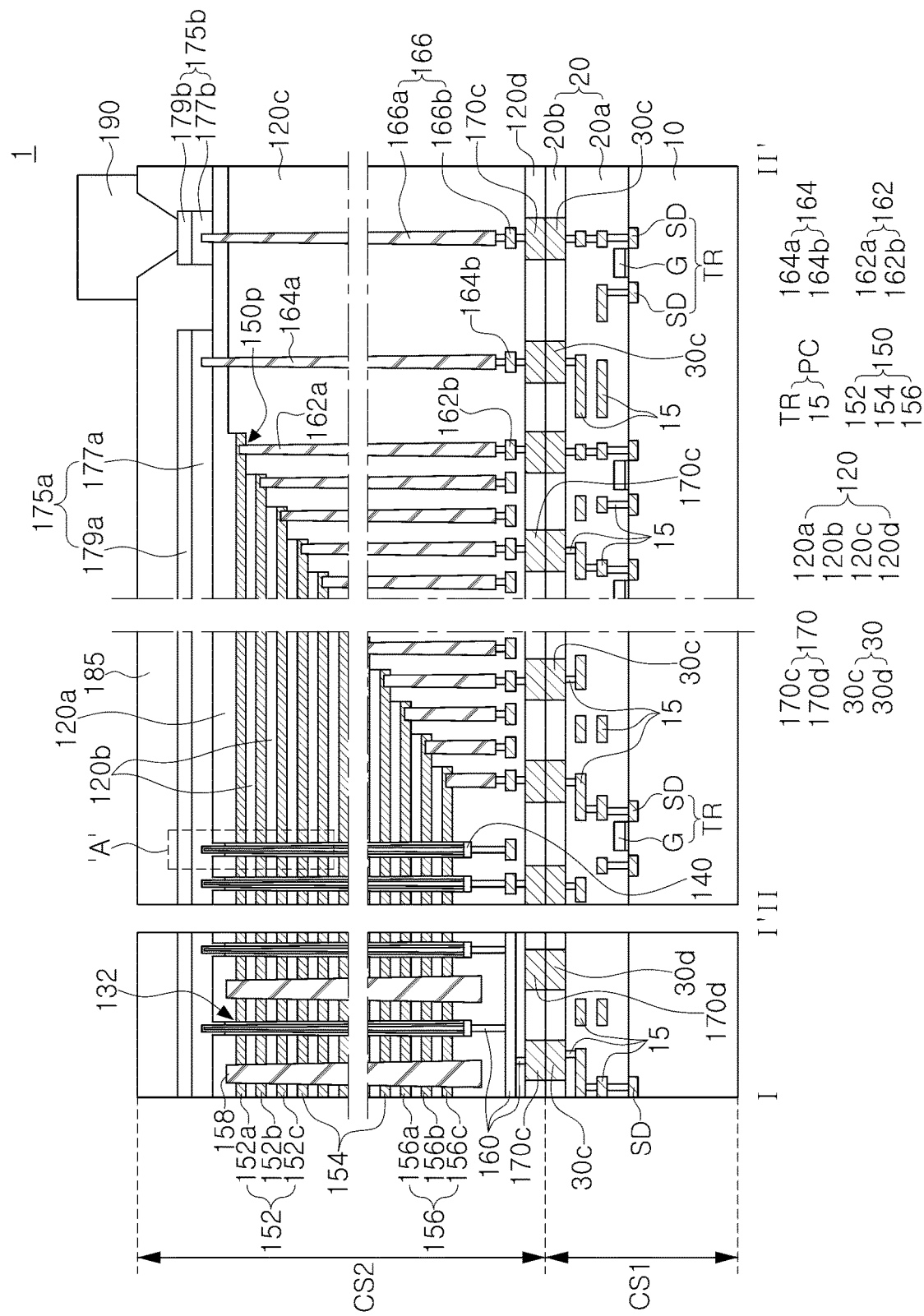
FIG. 3 is a cross-sectional view illustrating an example of a semiconductor device according to an embodiment of the present inventive concept.
Figure 4:
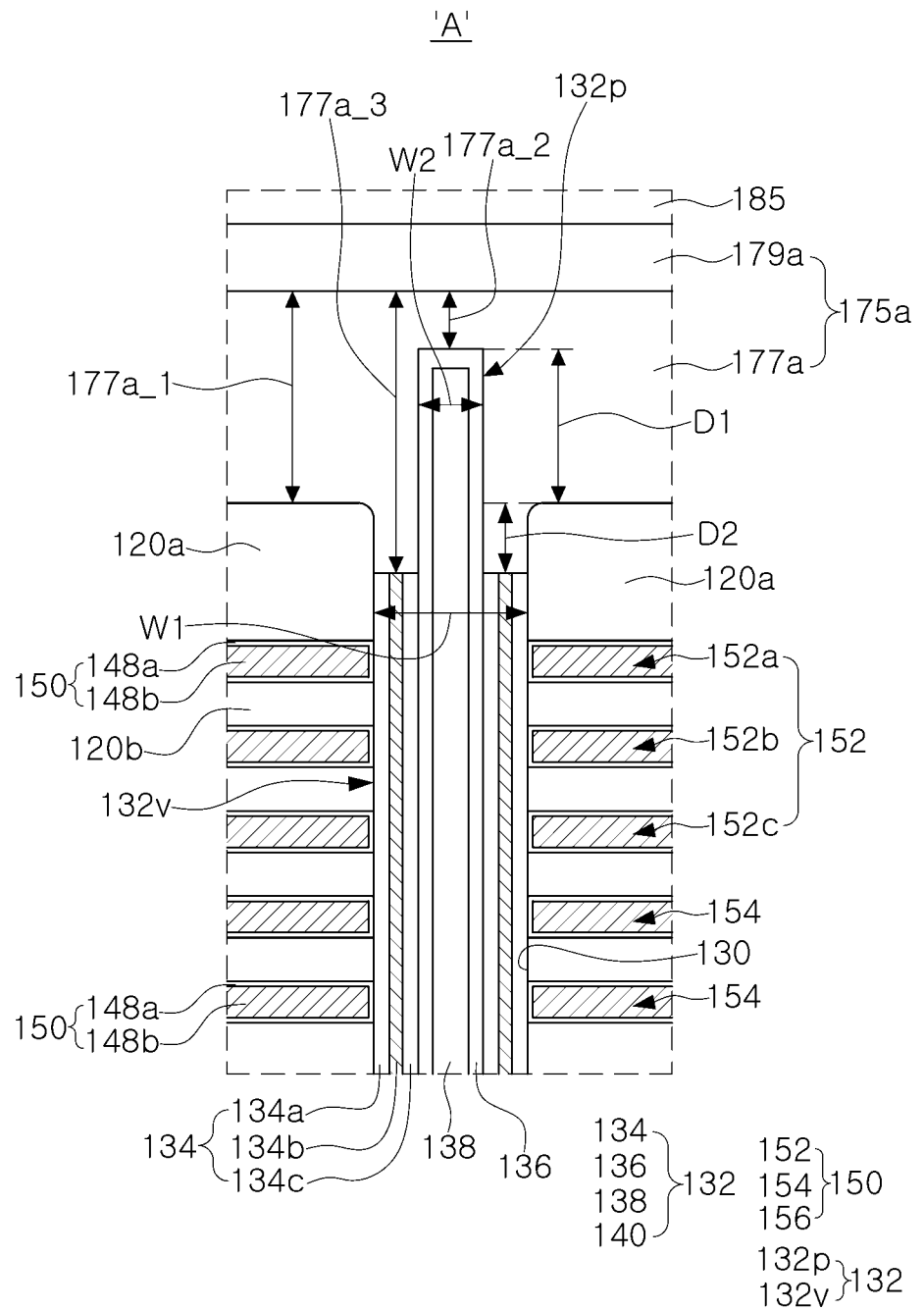
FIG. 4 is a partially enlarged view illustrating an example of a semiconductor device according to an embodiment of the present inventive concept.

Hereinafter, an example of the semiconductor device 1 will be described with reference to FIGS. 2 to 3. FIG. 2 is a plan view schematically illustrating some components of the semiconductor device 1, and FIG. 3 is a cross-sectional view illustrating regions taken along lines I-I' and II-IF of FIG. 2. FIG. 4 is an enlarged view of portion 'A' of FIG. 3.

Referring to FIGS. 2 and 3 together with FIG. 1, the first chip structure CS1 may include a substrate 10, a first insulating structure 20 on the substrate 10, the peripheral circuit PC including a first chip wiring structure 15 in the first insulating structure 20, and a first junction pads 30 in the first insulating structure 20. The substrate 10 may be a semiconductor substrate, for example, a single crystal silicon substrate.

The peripheral circuit PC may include circuit transistors TR electrically connected by the first chip wiring structure 15.

Among the first junction pads 30, first junction pads electrically connected to the first chip wiring structure 15 of the peripheral circuit PC may be defined as first circuit junction pads 30c, and, among the first junction pads 30, first junction pads not electrically connected to the peripheral circuit PC may be defined as first dummy junction pads 30d.

The first insulating structure 20 may include a first internal insulating structure 20a and a first junction insulating layer 20b on the first internal insulating structure 20a.

The peripheral circuit PC may be disposed in the first internal insulating structure 20a. The first junction insulating layer 20b may surround side surfaces of the first junction pads 30.

The second chip structure CS2 may include a conductive material pattern 175a, a second insulating structure 120, a plurality of horizontal layers 150, a vertical structure 132, and second junction pads 170. As used herein, 'horizontal' may refer to a direction extending along (e.g., parallel to) a surface of the substrate 10, while 'vertical' may refer to a direction protruding from (e.g., perpendicular to) a surface of the substrate 10. A 'side surface' may extend in the vertical direction.

The second insulating structure 120 may include a lower insulating layer 120a, a plurality of interlayer insulating layers 120b, a capping insulating layer 120c, and a second junction insulating layer 120d. The plurality of interlayer insulating layers 120b and the capping insulating layer 120c may be arranged between the lower insulating layer 120a and the second junction insulating layer 120d.

In an example, the second junction pads 170 may include second circuit junction pads 170c and a second dummy junction pad 170d.

The second junction pads 170 may be in contact with and joined to the first junction pads 30. The second circuit junction pads 170c may be in contact with and joined to the first circuit junction pads 30c, and the second dummy junction pad 170d may be in contact with and joined to the first dummy junction pad 30d. The second junction insulating layer 120d may be in contact with and joined to the first junction insulating layer 20b.

In an example, the first and second junction pads 30 and 170 may be formed of a conductive material, for example, copper, a copper alloy, or the like, which may be bonded while being in contact with each other. The first and second junction insulating layers 20b and 120d may be formed of an insulating material, for example, silicon oxide, which may be in contact with and bonded to each other. The first and second junction insulating layers 20b and 120d are not limited to silicon oxide, but may be also formed of SiCN or the like.

The conductive material pattern 175a may be disposed on the lower insulating layer 120a of the second insulating structure 120.

In an example, the conductive material pattern 175a may include a first material layer 177a and a second material layer 179a on the first material layer 177a. The second material layer 179a may have lower resistivity than the first material layer 177a.

In an example, the first material layer 177a may include a doped semiconductor material layer. The doped semiconductor material layer may be formed of doped polysilicon. For example, the doped semiconductor material layer of the first material layer 177a may be formed of doped polysilicon having N-type conductivity. The second material layer 179b may be formed of a conductive material such as a metal-semiconductor compound (e.g., a metal silicide or the like), a metal nitride (e.g., TiN, WN, or the like) or a metal (e.g., Ti, W, Al, copper, or the like).

The second chip structure CS2 may further include a conductive pad 175b disposed on the lower insulating layer 120a of the second insulating structure 120. The conductive pad 175b may be formed of the same material and with the same thickness as the conductive material pattern 175a. For example, the conductive pad 175b may include third and fourth material layers 177b and 179b corresponding to the first and second material layers 177a and 179a of the conductive material pattern 175a, respectively.

The plurality of horizontal layers 150 may be spaced apart from each other and stacked in the second insulating structure 120. The plurality of horizontal layers 150 and the interlayer insulating layers 120b may be alternately and repeatedly stacked.

The plurality of horizontal layers 150 may include pad regions 150p. The pad regions 150p of the plurality of horizontal layers 150 may have a stepped structure lowered in a direction close to the conductive material pattern 175a. For example, respective lengths of the horizontal layers 150 in the stack may decrease with distance from the conductive material pattern 175a.

The plurality of horizontal layers 150 may include lower horizontal layers 152, intermediate horizontal layers 154, and upper horizontal layers 156.

The intermediate horizontal layers 154 may be disposed between the lower horizontal layers 152 and the upper horizontal layers 156.

The lower horizontal layers 152 may be disposed closer to the conductive material pattern 175a, and the upper horizontal layers 156 may be disposed closer to the first chip structure CS1.

The lower horizontal layers 152 may include a first lower horizontal layer 152a, a second lower horizontal layer 152b, and a third lower horizontal layer 152c, that are sequentially spaced apart from the conductive material pattern 175a. The upper horizontal layers 156 may include a first upper horizontal layer 156a, a second upper horizontal layer 156b, and a third upper horizontal layer 156c, that are sequentially spaced apart from the conductive material pattern 175a. Each of the plurality of horizontal layers 150 may include a conductive material.

In an example, each of the plurality of horizontal layers 150 may include a first layer 148a and a second layer 148b.

In an example, the first layer 148a may extend between the second layer 148b and the vertical structure 132 while extending along or covering an upper surface and a lower surface of the second layer 148b. As used herein, 'covering' may not require complete coverage.

In an example, the first layer 148a and the second layer 148b may be different conductive materials. For example, the first layer 148a may include a metal nitride such as TiN or the like, and the second layer 148b may include a metal such as W or the like.

In another example, the first layer 148a may be formed of an insulating material such as a high dielectric material or the like, and the second layer 148b may be formed of a conductive material.

The lower horizontal layers 152 may include a gate layer of an erase transistor used for an erase operation of a vertical NAND flash memory device using a gate induced drain leakage (GIDL) phenomenon, and a ground select gate layer of a ground select transistor located below (relative to the conductive material pattern 175a) the gate layer of the erase transistor used for the erase operation. For example, the first and second lower horizontal layers 152a and 152b may be gate layers of an erase transistor, and the third lower horizontal layer 152c may be the ground select gate layer.

The upper horizontal layers 156 may include a gate layer of an erase transistor used for an erase operation of a vertical NAND flash memory device using a gate induced drain leakage (GIDL) phenomenon, and a string select gate layer of a string select transistor located below the gate layer of the erase transistor used for the erase operation. For example, the first upper horizontal layer 156a may be a string select gate layer, and the second and third upper horizontal layers 156b and 156c may be gate layers of an erase transistor.

At least a portion of the intermediate horizontal layers 154 may be wordlines of a vertical NAND flash memory device.

The vertical structure 132 may pass through the plurality of horizontal layers 150 in the second insulating structure 120, and may extend into the conductive material pattern 175a.

The second chip structure CS2 may further include wiring structures 160, 162, 164, and 166 in the capping insulating layer 120c. The wiring structures 160, 162, 164, and 166 may include a bitline structure 160, a gate wiring structure 162, a source wiring structure 164, and an input/output wiring structure 166.

In an example, the bitline structure 160 may include a bitline electrically connected to a pad pattern 140 of the vertical structure 132. The bitline structure 160 may be electrically connected to the second circuit junction pads 170c.

In an example, the gate wiring structure 162 may include gate contact plugs 162a and gate connection patterns 162b. The gate contact plugs 162a may contact the pad regions 150p of the plurality of horizontal layers 150. The gate connection patterns 162b may be electrically connected to the gate contact plugs 162a and the second circuit junction pads 170c.

In an example, the source wiring structure 164 may include a source contact plug 164a and a source connection pattern 164b electrically connecting the source contact plug 164a and the second circuit junction pad 170c.

The source contact plug 164a may extend from a portion disposed in the second insulating structure 120 into the first material layer 177a of the conductive material pattern 175a.

In an example, the input/output wiring structure 166 may include an input/output contact plug 166a and an input/output connection pattern 166b for electrically connecting the input/output contact plug 166a and the second circuit junction pads 170c. The input/output contact plug 166a may extend from a portion disposed in the second insulating structure 120 into the third material layer 177b of the conductive pad 175b.

The second chip structure CS2 may further include a cover insulating layer 185 covering the conductive material pattern 175a on the second insulating structure 120 and having an opening exposing at least a portion of the conductive pad 175b, and the input/output pad 190 on the conductive pad 175b exposed from the cover insulating layer 185. The input/output pad 190 may be provided as a plurality of input/output pads 190, as illustrated in FIG. 1.

The vertical structure 132 may be disposed in a channel hole 130 penetrating through the plurality of horizontal layers 150 in the second insulating structure 120.

The vertical structure 132 may include a vertical portion 132v and a protruding portion 132p extending from the vertical portion 132v.

The vertical structure 132 may include a core region 138, a channel layer 136, a dielectric structure 134, and a pad pattern 140.

The core region 138 may extend from a portion located in the vertical portion 132v into the protruding portion 132p. The core region 138 may pass through the plurality of horizontal layers 150 and may extend into the conductive material pattern 175a. The core region 138 may include an insulating material or an insulating material having voids formed therein.

The pad pattern 140 may be formed of polysilicon having N-type conductivity. The pad pattern 140 may contact the channel layer 136. The pad pattern 140 may be located in an end portion of the vertical structure 132, close to the first chip structure CS1.

The channel layer 136 may extend from a portion located in the vertical portion 132v into the protruding portion 132p. The channel layer 136 may pass through the plurality of horizontal layers 150 and may extend into the conductive material pattern 175a. The channel layer 136 may be formed of polysilicon.

The dielectric structure 134 may be located in the vertical portion 132v.

The channel layer 136 may be disposed between the dielectric structure 134 in the vertical portion 132v and the core region 138.

In the protruding portion 132p, the channel layer 136 may be in contact with the conductive material pattern 175a. In the protruding portion 132p, the channel layer 136 may be in contact with the doped semiconductor material layer of the first material layer 177a of the conductive material pattern 175a. In the protruding portion 132p, a side surface of the channel layer 136 may at least be in contact with the doped semiconductor material layer of the first material layer 177a of the conductive material pattern 175a.

The dielectric structure 134 may include a first dielectric layer 134a, a second dielectric layer 134c, and a data storage material layer 134b between the first and second dielectric layers 134a and 134c. The data storage material layer 134b may be a charge trap layer, such as silicon nitride or the like. The data storage material layer 134b may include regions capable of storing information in a semiconductor device such as a vertical NAND flash memory device or the like. For example, the data storage material layer 134b may have data storage regions, in regions facing the intermediate horizontal layers 154, which may be wordlines. The data storage regions of the data storage material layer 134b may constitute memory cells. The data storage regions of the data storage material layer 134b may be three-dimensionally arranged. Therefore, the memory cell array (MCA of FIG. 1) may include memory cells arranged in three dimensions.

In any one vertical structure 132, the data storage material layer 134b may be continuous in the vertical direction, but the technical spirit of the present inventive concept is not limited thereto. For example, in one example vertical structure 132, the data storage material layer 134b may be formed of respective data storage patterns that are facing the plurality of horizontal layers 150 while being spaced apart from each other in the vertical direction. In this case, the vertical direction may be a direction perpendicular to the substrate 10.

In the vertical structure 132, a maximum width (W1) of the vertical portion 132v may be greater than a maximum width (W2) of the protruding portion 132p. The minimum width of the vertical portion 132v may be greater than the maximum width of the protruding portion 132p.

The first material layer 177a of the conductive material pattern 175a may include a first portion 177a_1 overlapping the plurality of horizontal layers 150, a second portion 177a_2 overlapping the protruding portion 132p of the vertical structure 132, and a third portion 177a_3 between the first portion 177a_1 and the second portion 177a_2.

In the first material layer 177a of the conductive material pattern 175a, vertical thicknesses of the first portion 177a_1, the second portion 177a_2, and the third portion 177a_3 may be different from each other. For example, a vertical thickness of the first portion 177a_1 may be greater than a vertical thickness of the second portion 177a_2, and a vertical thickness of the first portion 177a_1 may be smaller than a vertical thickness of the third portion 177a_3.

A distance between the first lower horizontal layer 152a and the first portion 177a_1 may be greater than a distance between the first lower horizontal layer 152a and the third portion 177a_3.

The lower insulating layer 120a may be disposed between the first lower horizontal layer 152a and the conductive material pattern 175a. The lower insulating layer 120a may have a thickness greater than a thickness of each of the interlayer insulating layers 120b.

The protruding portion 132p may protrude from the lower insulating layer 120a by a first distance (D1), and the third portion 177a_3 may extend into the lower insulating layer 120a by a second distance (D2), than the first portion 177a_1. A distance of the protruding portion 132p in the vertical direction may be equal to the sum of the first distance (D1) and the second distance (D2).

In an example, the first distance (D1) may be greater than the second distance (D2).

In an example, the first distance (D1) may be equal to or greater than the width (W1) of the vertical portion 132v.

Figure 5A:
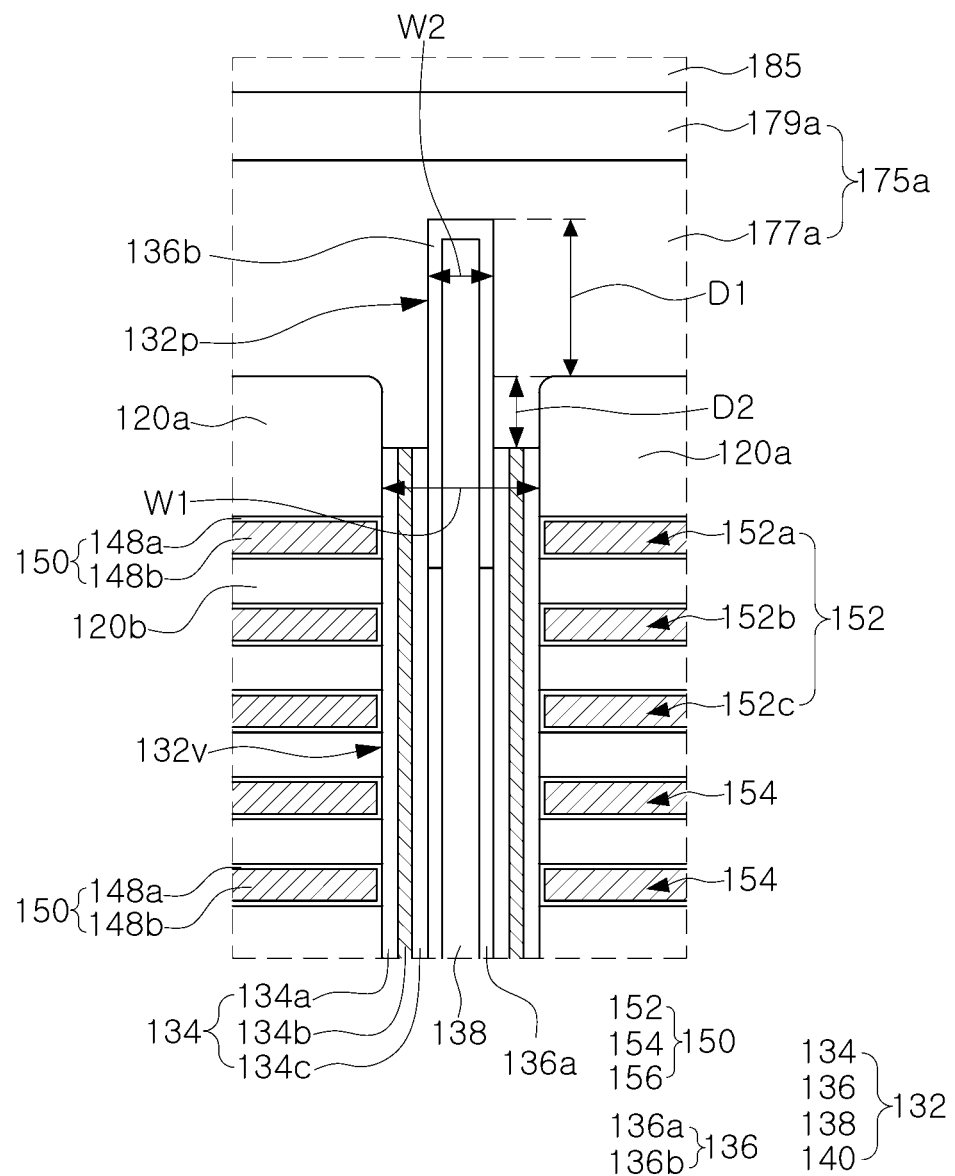
FIG. 5A is a partially enlarged view illustrating a further example of a semiconductor device according to an embodiment of the present inventive concept.

Next, a further example of the channel layer 136 will be described with reference to FIG. 5A. FIG. 5A is a partially enlarged view corresponding to FIG. 4.

In a further example, referring to FIG. 5A, the channel layer 136 may include an undoped portion 136a not implanted with an impurity, and a doped portion 136b implanted with an N-type impurity. The doped portion 136b of the channel layer 136 may be disposed in the protruding portion 132p of the vertical structure 132 and may extend into the vertical portion 132v of the vertical structure 132.

In an example, at least one of the lower horizontal layers 152 may face the doped portion 136b of the channel layer 136. For example, the first lower horizontal layer 152a may face the doped portion 136b of the channel layer 136, and the third lower horizontal layer 152c may face the undoped portion 136a of the channel layer 136. The second lower horizontal layer 152b may face the undoped portion 136a.

As described above, the first lower horizontal layer 152a may be a gate layer of an erase transistor used for an erase operation of a vertical NAND flash memory device using a gate induced drain leakage (GIDL) phenomenon. An erase efficiency using the GIDL phenomenon of the vertical NAND flash memory device may be increased by forming the doped portion 136b of the channel layer 136 to face the first lower horizontal layer 152a.

Figure 5B:
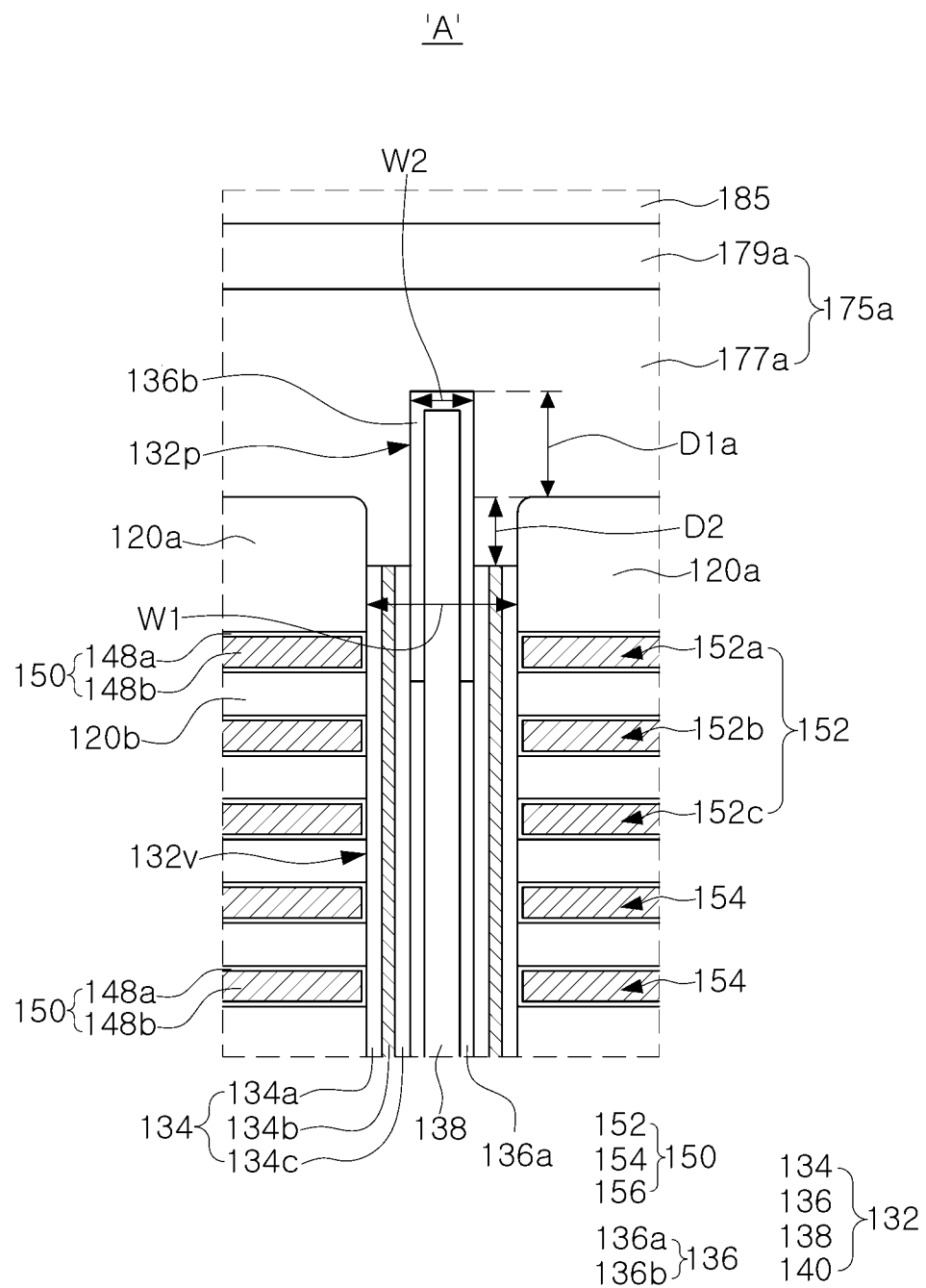
FIG. 5B is a partially enlarged view illustrating a further example of a semiconductor device according to an embodiment of the present inventive concept.

Next, a further example of the protruding portion 132p of the vertical structure 132 will be described with reference to FIG. 5B. FIG. 5B is a partially enlarged view corresponding to FIG. 4.

In a further example, referring to FIG. 5B, the protruding portion 132p of the vertical structure 132 may protrude from the lower insulating layer 120a by a first distance (D1a). The first distance (D1a) may be smaller than the width (W1) of the vertical portion 132v.

Figure 6A:
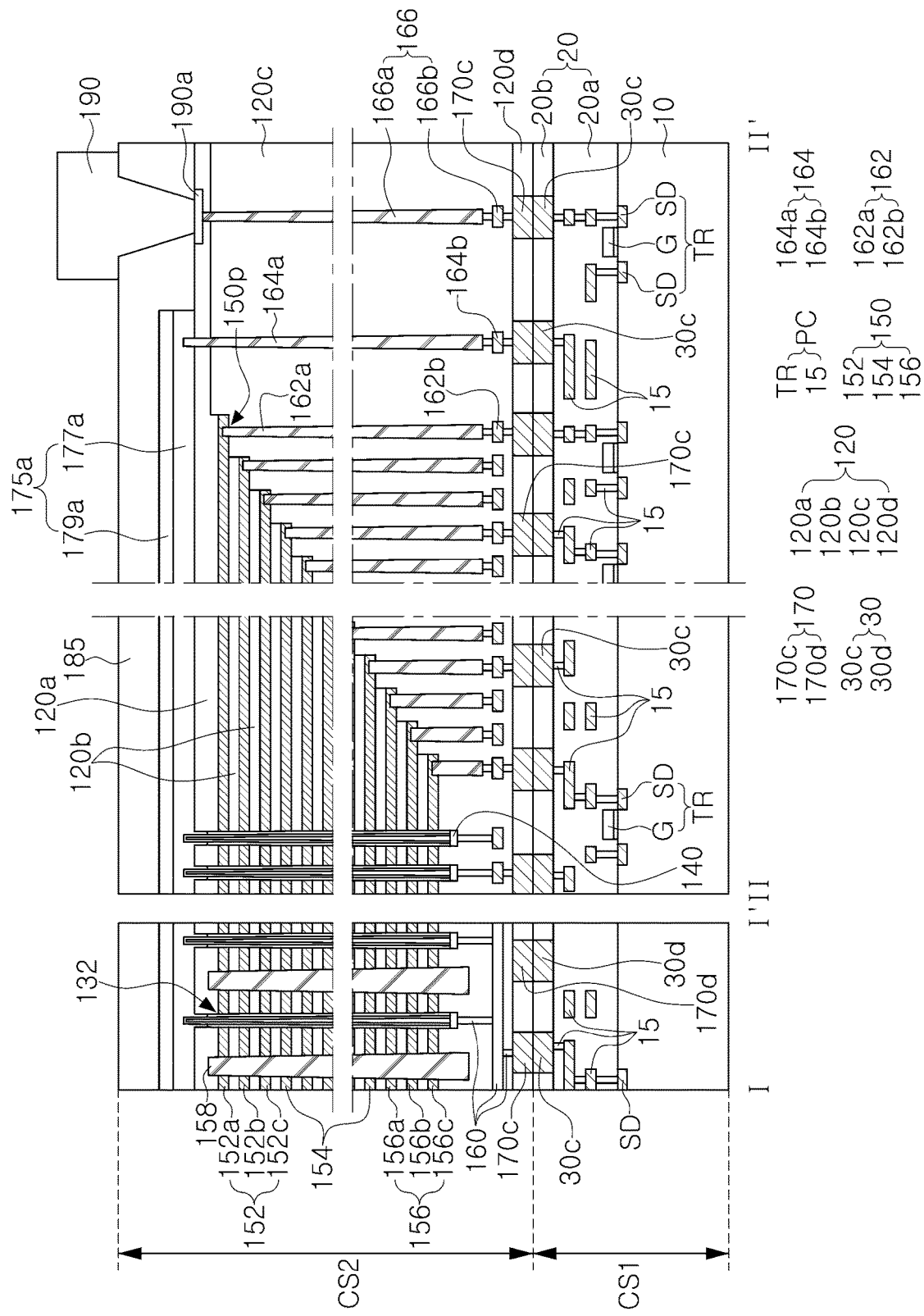
FIG. 6A is a cross-sectional view illustrating a further example of a semiconductor device according to an embodiment of the present inventive concept.
Figure 6B:
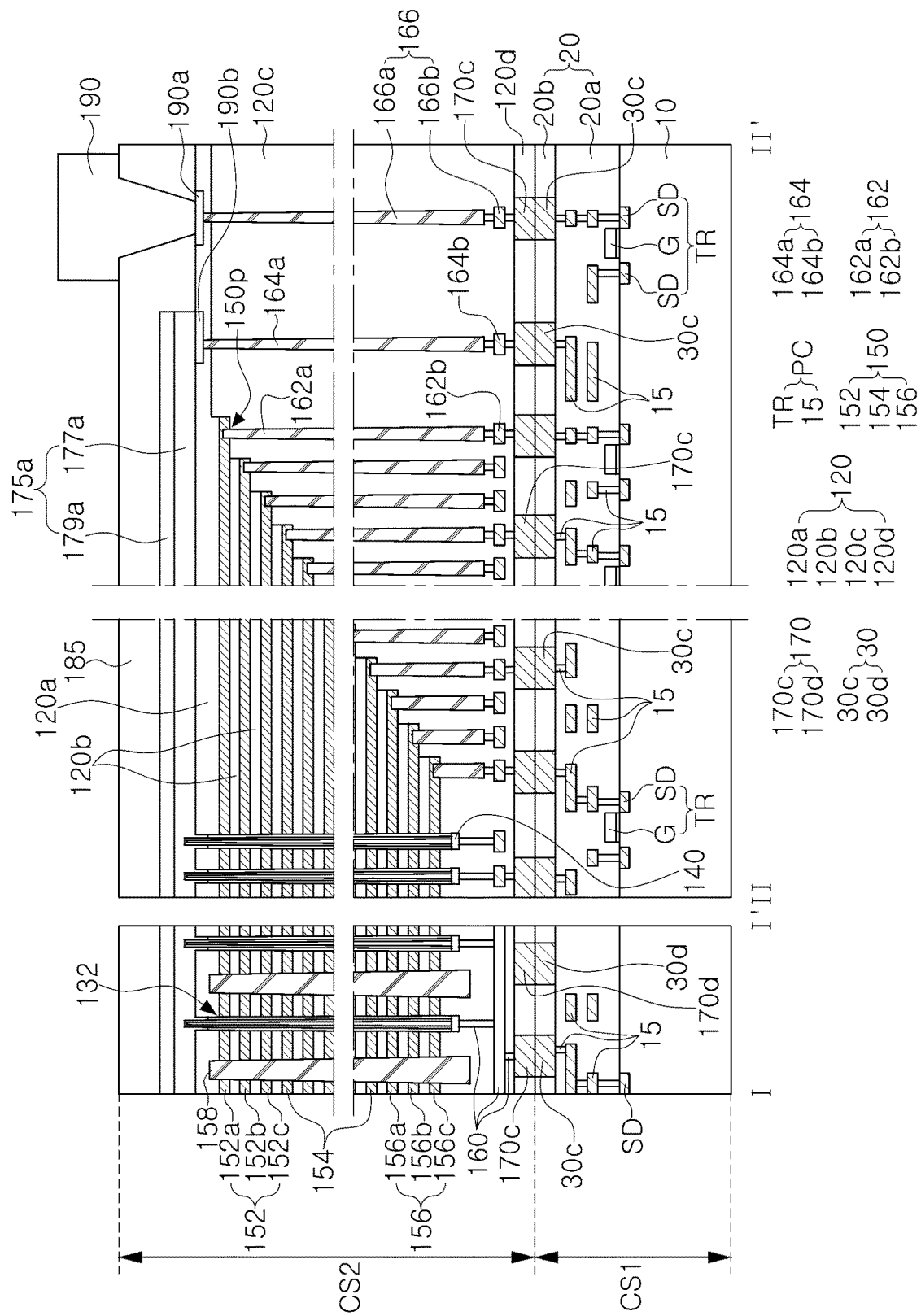
FIG. 6B is a cross-sectional view illustrating a further example of a semiconductor device according to an embodiment of the present inventive concept.
Figure 6C:
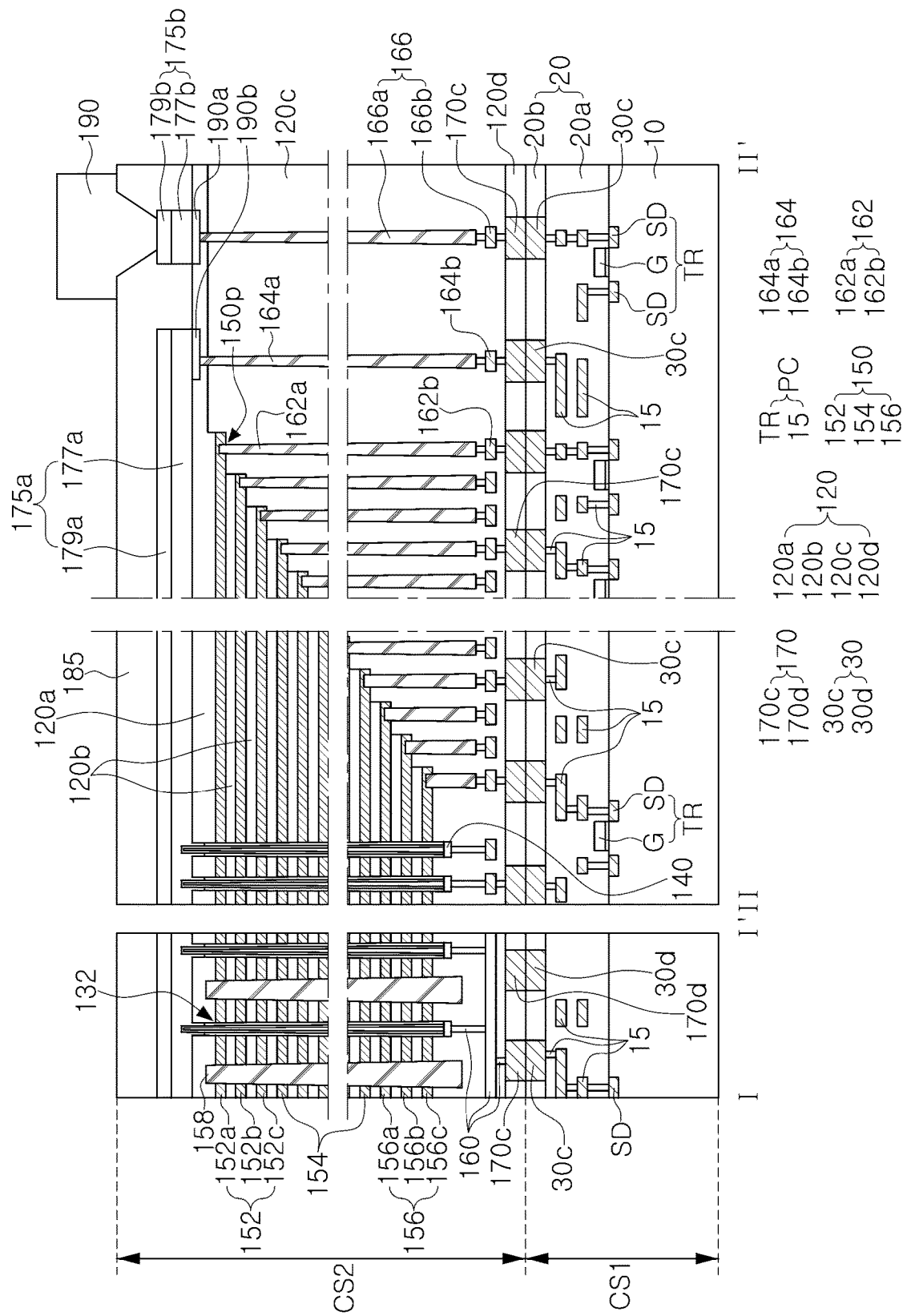
FIG. 6C is a cross-sectional view illustrating a further example of a semiconductor device according to an embodiment of the present inventive concept.

Next, various modified examples of a semiconductor device according to an embodiment of the present inventive concept will be described with reference to FIGS. 6A to 6C, respectively. FIGS. 6A to 6C are cross-sectional views illustrating regions taken along lines I-I' and II-IF of FIG. 2, to describe various modified examples of a semiconductor device according to an embodiment of the present inventive concept.

In a further example, referring to FIG. 6A, instead of the conductive pad 175b described in FIG. 3, a first conductive pad 190a surrounded by the second insulating structure 120 may be provided. A side surface of the first conductive pad 190a may be surrounded by the lower insulating layer 120a of the second insulating structure 120. The first conductive pad 190a may be electrically connected to the input/output pad 190. An upper surface of the first conductive pad 190a and an upper surface of the lower insulating layer 120a may be coplanar. The first conductive pad 190a may be formed of a conductive material such as a metal-semiconductor compound (e.g., metal silicide or the like), a metal nitride (e.g., TiN, WN, or the like), a metal (e.g., Ti, Cu, W, or the like), or the like.

In a further example, referring to FIG. 6B, instead of the conductive pad 175b described in FIG. 3, the first conductive pad 190a as in FIG. 6A may be provided. In addition, a second conductive pad 190b may be disposed below the conductive material pattern 175a and in the second insulating structure 120. The second conductive pad 190b may be formed of the same material and the same thickness as the first conductive pad 190a. The second conductive pad 190b may contact the first material layer 177a of the conductive material pattern 175a. The second conductive pad 190b may be in contact with the source contact plug 164a.

In a further example, referring to FIG. 6C, a first conductive pad 190a below the conductive pad 175b and in the second insulating structure 120, and a second conductive pad 190b below the conductive material pattern 175a and in the second insulating structure 120 may be arranged. The first conductive pad 190a may be in contact with the conductive pad 175b and the input/output contact plug 166a, and the second conductive pad 190b may be in contact with the first material layer 177a of the conductive material pattern 175a and the source contact plug 164a. The first and second conductive pads 190a and 190b may be formed of the same material and the same thickness. The first and second conductive pads 190a and 190b may be formed of a conductive material such as a metal-semiconductor compound (e.g., metal silicide or the like), a metal nitride (e.g., TiN, WN, or the like), a metal (e.g., Ti, Cu, W, or the like), or the like. The first conductive pad 190a may be referred to a first buffer pad, and the second conductive pad 190b may be referred to a second buffer pad.

Figure 7:
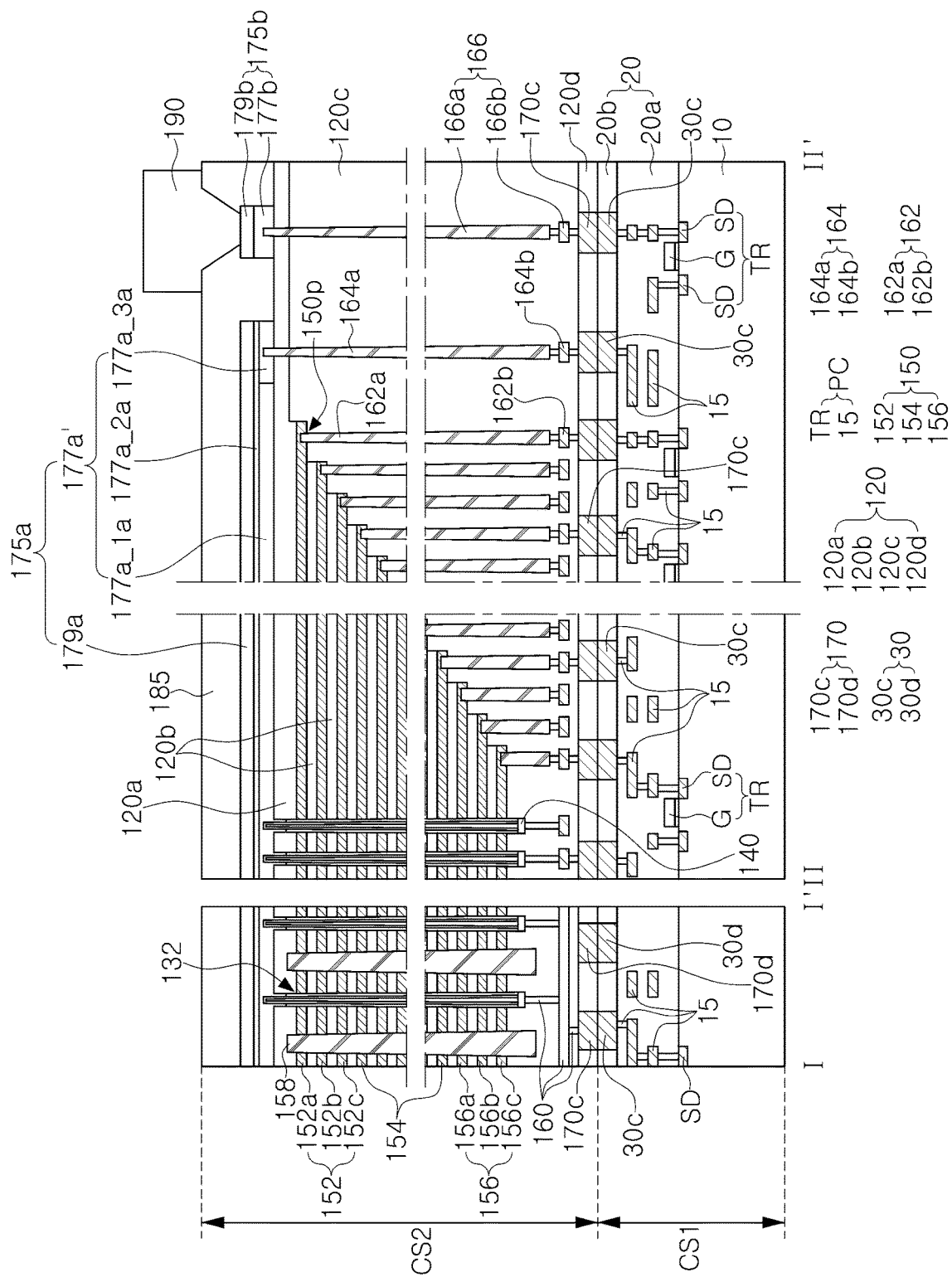
FIG. 7 is a cross-sectional view illustrating a further example of a semiconductor device according to an embodiment of the present inventive concept.

Next, a further example of the first material layer 177a of the conductive material pattern 175a will be described with reference to FIG. 7. FIG. 7 is a cross-sectional view illustrating regions taken along lines II' and II-IF of FIG. 2, to describe a further example of the first material layer 177a of the conductive material pattern 175a.

In a further example, referring to FIG. 7, the first material layer (177a of FIG. 3) described in FIG. 3 having N-type conductivity may be replaced with a first material layer 177a' including a P-type portion 177a1a having P-type conductivity, and a first N-type portion 177a2a and a second N-type portion 177a_3a having N-type conductivity.

The P-type portion 177a_1a of the first material layer 177a' may be in contact with the vertical structure 132. The first N-type portion 177a_2a and the second N-type portion 177a3a of the first material layer 177a' may be spaced apart from the vertical structure 132. The first N-type portion 177a_2a may be in contact with the second material layer 179a. The second N-type portion 177a_3a may be in contact with the source contact plug 164a.

The third material layer 177b of the conductive pad 175b may have N-type conductivity type.

Figure 8:
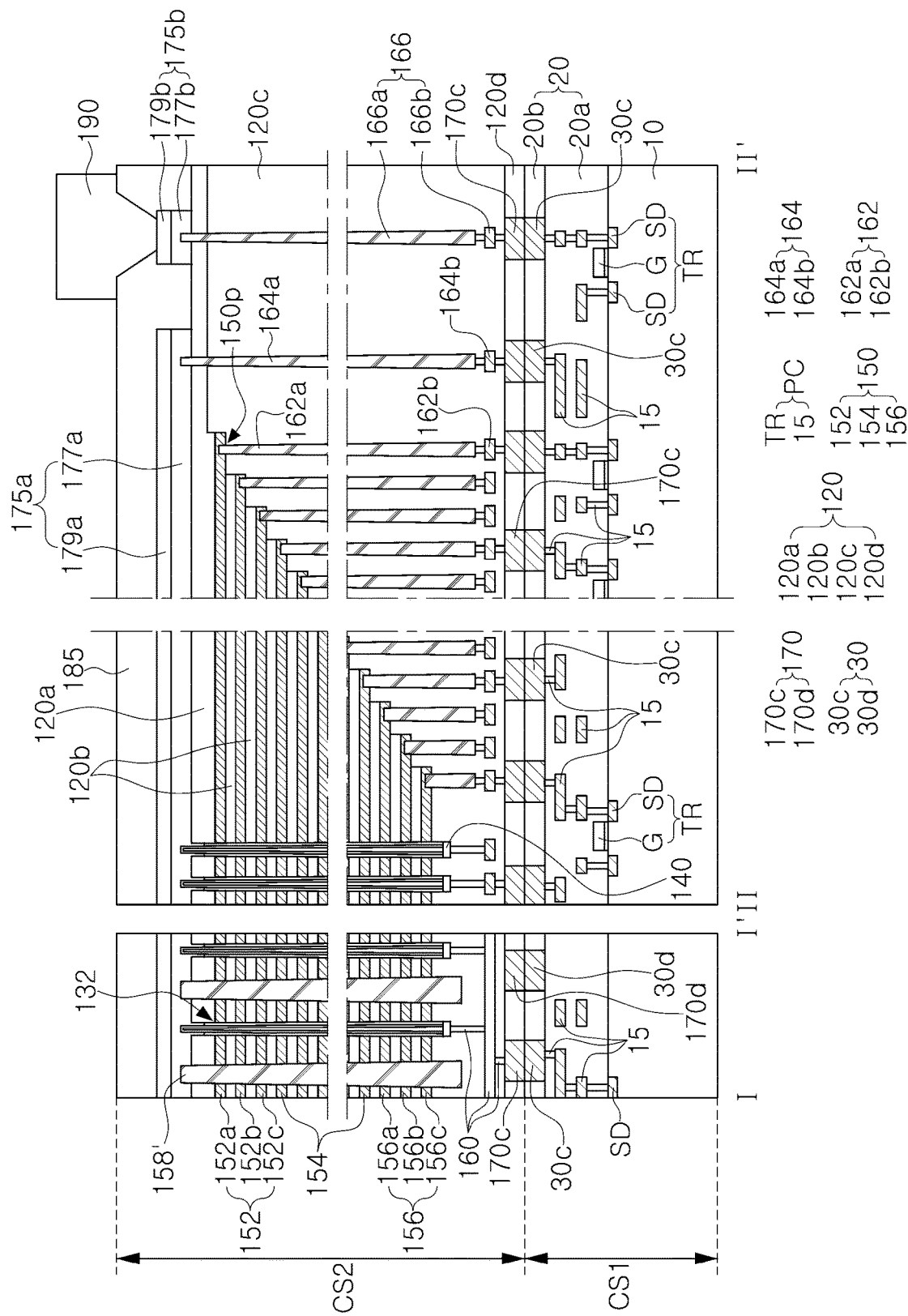
FIG. 8 is a cross-sectional view illustrating a further example of a semiconductor device according to an embodiment of the present inventive concept.

Next, a further example of a separation structure 158 will be described with reference to FIG. 8. FIG. 8 is a cross-sectional view illustrating regions taken along lines I-I' and II-IF of FIG. 2, to describe a further example of the separation structure 158.

In a further example, referring to FIG. 8, the separation structure 158 of FIG. 3 spaced apart from the conductive material pattern 175a described in FIG. 3 may be replaced with a separating structure 158' contacting the first material layer 177a of the conductive material pattern 175a.

Figure 9:
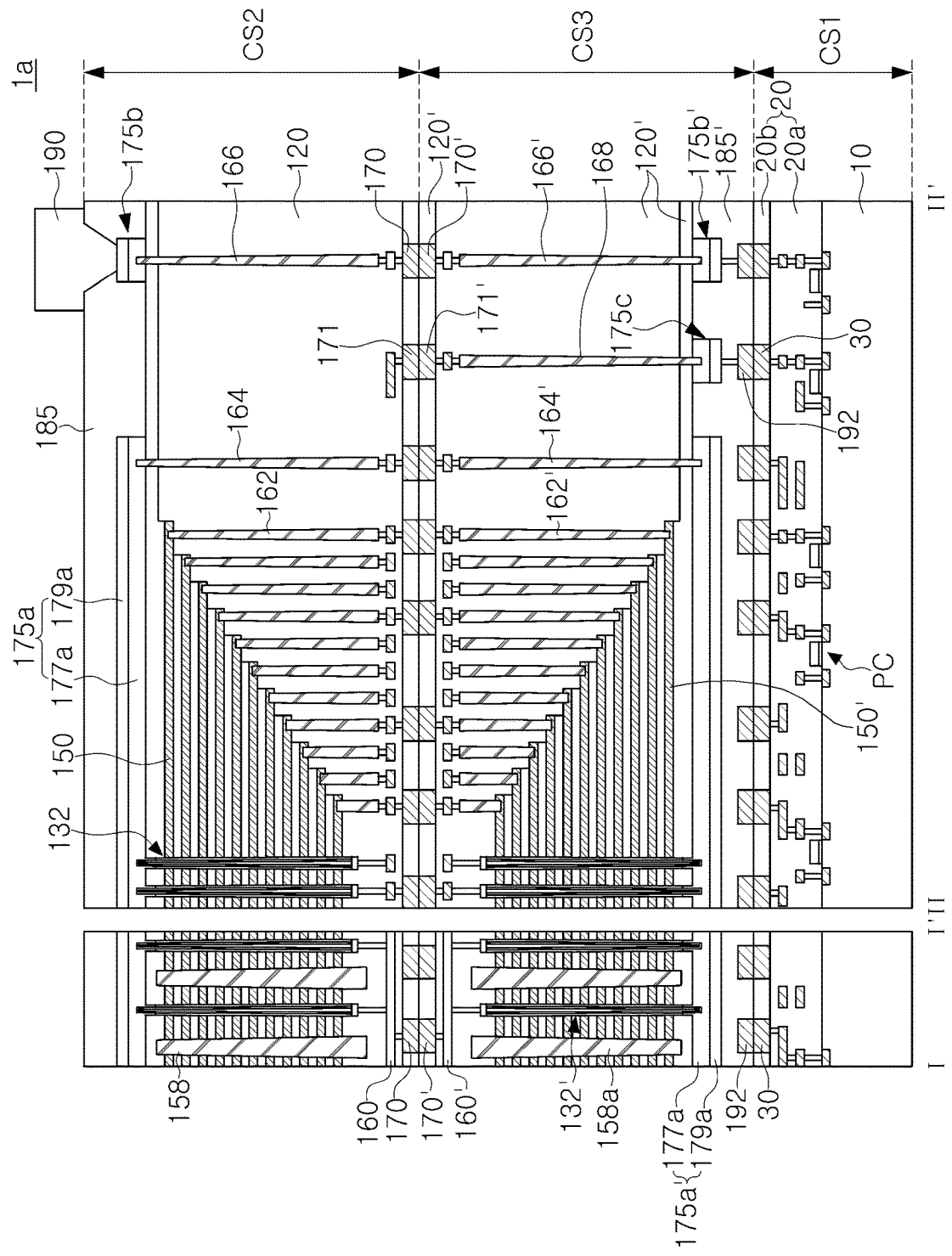
FIG. 9 is a cross-sectional view illustrating a further example of a semiconductor device according to an embodiment of the present inventive concept.

Next, a further example of a semiconductor device according to an embodiment of the present inventive concept will be described with reference to FIG. 9. FIG. 9 may be a cross-sectional view illustrating regions taken along lines I-I' and II-IF of FIG. 2.

In a further example, referring to FIG. 9, a semiconductor device 1a in the modified example may further include a third chip structure CS3, in comparison to the semiconductor device 1 described with reference to FIGS. 1 to 4. The third chip structure CS3 may be disposed between the first chip structure CS1 and the second chip structure CS2 which are the same or similar to as described with reference to FIGS. 1 to 4. Therefore, since the description of each of the first chip structure CS1 and the second chip structure CS2 may be the same or similar to as described above, a detailed description thereof will be omitted.

The third chip structure CS3 may include a conductive material pattern 175a', a conductive pad 175b', a third insulating structure 120', a plurality of horizontal layers 150', a vertical structure 132', a separation structure 158a, wiring structures 160', 162', 164', and 166', and third junction pads 170' corresponding to the conductive material pattern 175a, the conductive pad 175b, the second insulating structure 120, the plurality of horizontal layers 150, the vertical structure 132, the separation structure 158, the wiring structures 160, 162, 164, and 166, and the second junction pads 170 of the second chip structure CS1, respectively.

In the third chip structure CS3, the third junction pads 170' may be in contact with and joined to the second junction pads 170 of the second chip structure CS2, and the third insulating structure 120' may be in contact with and joined to the second insulating structure 120 of the second chip structure CS2.

The third chip structure CS3 may further include an intermediate junction insulating layer 185' covering the conductive material pattern 175a' and the conductive pad 175b', and intermediate junction pads 192 surrounded by the intermediate junction insulating layers 185', below the third insulating structure 120'.

In the third chip structure CS3, the intermediate junction insulating layer 185' may be in contact with and joined to the first insulation structure 20 of the first chip structure CS1, and the intermediate junction pads 192 may be in contact with and joined to the first junction pads 30 of the first chip structure CS1.

The second chip structure CS2 may further include an upper signal connection pattern 171, and the third chip structure CS3 may further include intermediate signal connection patterns 171', 168, 175c, and 192. The intermediate signal connection patterns 171', 168, 175c, and 192 of the third chip structure CS3 may be electrically connected to the upper signal connection pattern 171 of the second chip structure CS2, and may be electrically connected to the first junction pad 30 of the first chip structure CS1. Therefore, the first to third chip structures CS1, CS2, and CS3 may be electrically connected to each other by the intermediate signal connection patterns 171', 168, 175c, and 192, the upper signal connection pattern 171, and the first junction pad 30.

Next, an example of a method of forming a semiconductor device according to an embodiment of the present inventive concept will be described with reference to FIGS. 10 to 18.

Figure 10:
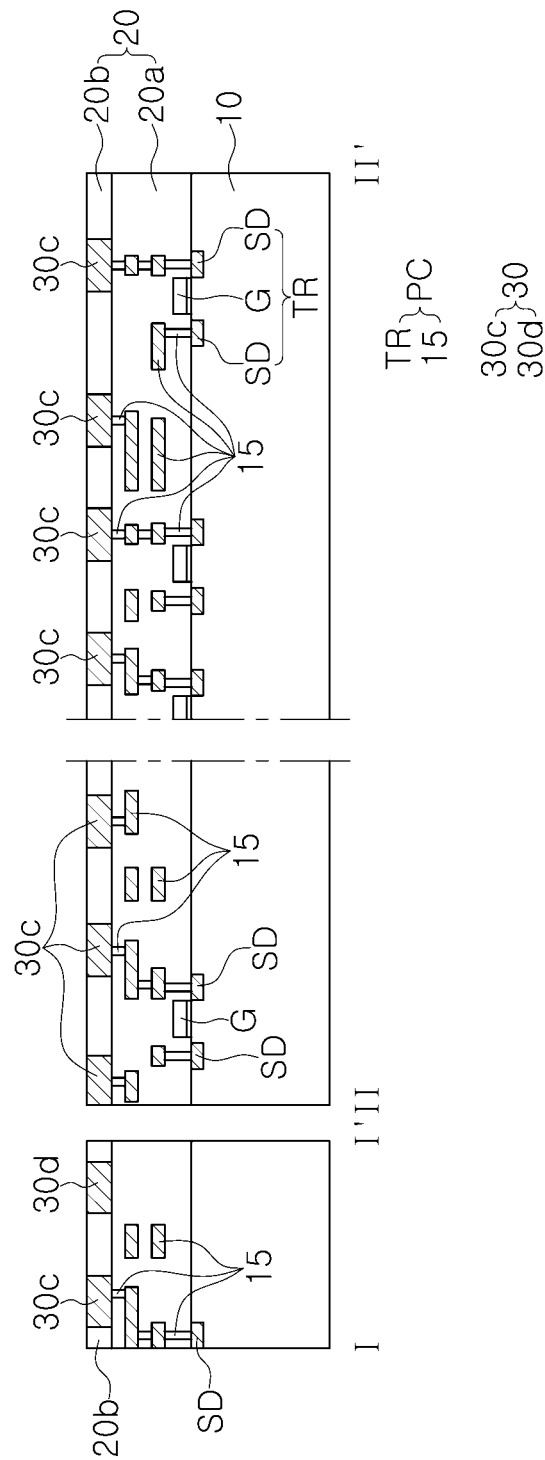
FIGS. 10 to 18 are views illustrating an example of a method of forming a semiconductor device according to an embodiment of the present inventive concept.

Referring to FIG. 10, a first chip structure CS1 may be formed. The first chip structure CS1 may include a substrate 10, a first insulating structure 20 formed on the substrate 10, a peripheral circuit PC formed in the first insulating structure 20, and first junction pads 30 formed in the first insulating structure 20 and on the peripheral circuit PC. The substrate 10 may be a semiconductor substrate, for example, a single crystal silicon substrate.

The peripheral circuit PC may be formed to include circuit transistors TR including a circuit source/drain S/D and a circuit gate G, and a first chip wiring structure 15 electrically connected to the circuit transistors TR. The first insulating structure 20 may include a first internal insulating structure 20a and a first junction insulating layer 20b formed on the first internal insulating structure 20a.

The peripheral circuit PC may be embedded in the first internal insulating structure 20a.

The first junction insulating layer 20b and the first junction pads 30 may have upper surfaces, coplanar with each other.

In an example, the first junction pads 30 may be formed of copper. The first junction pads 30 are not limited to copper, and may be formed of another conductive material or materials capable of forming a junction.

Figure 11A:
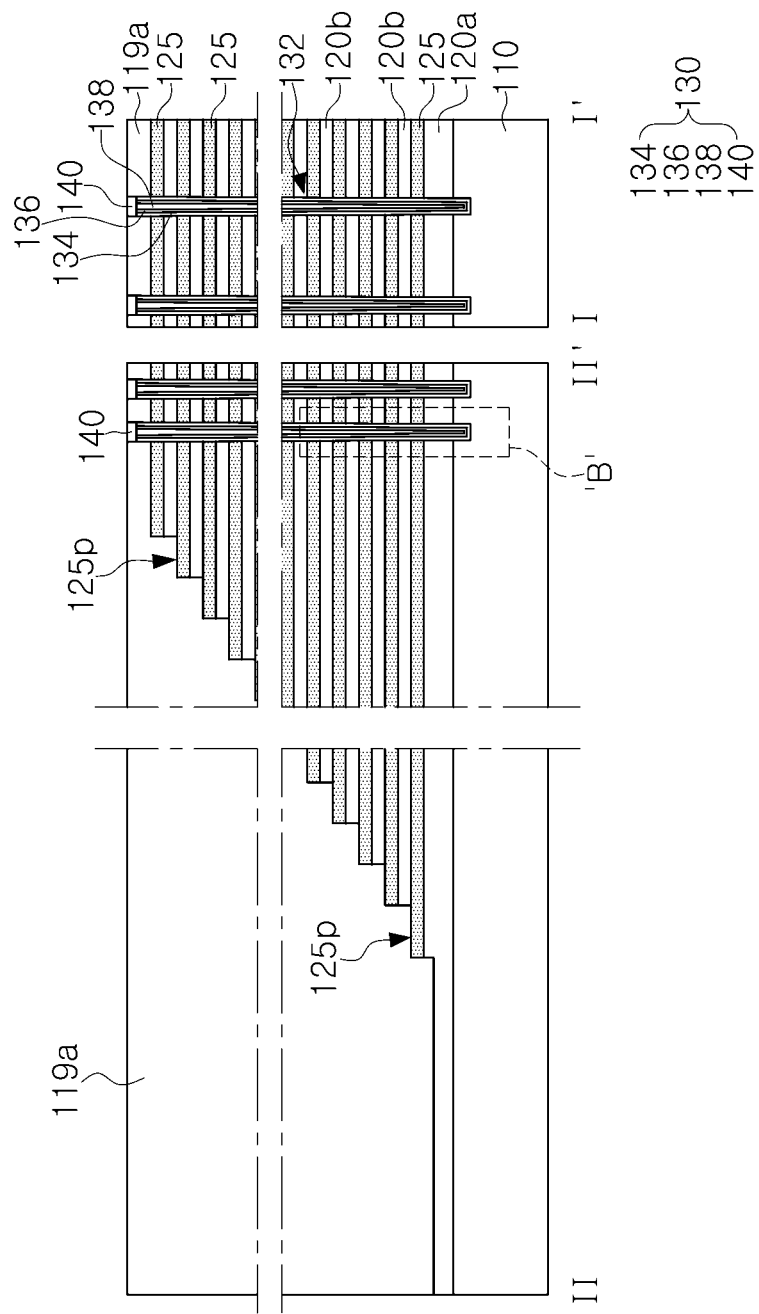
Figure 11B:
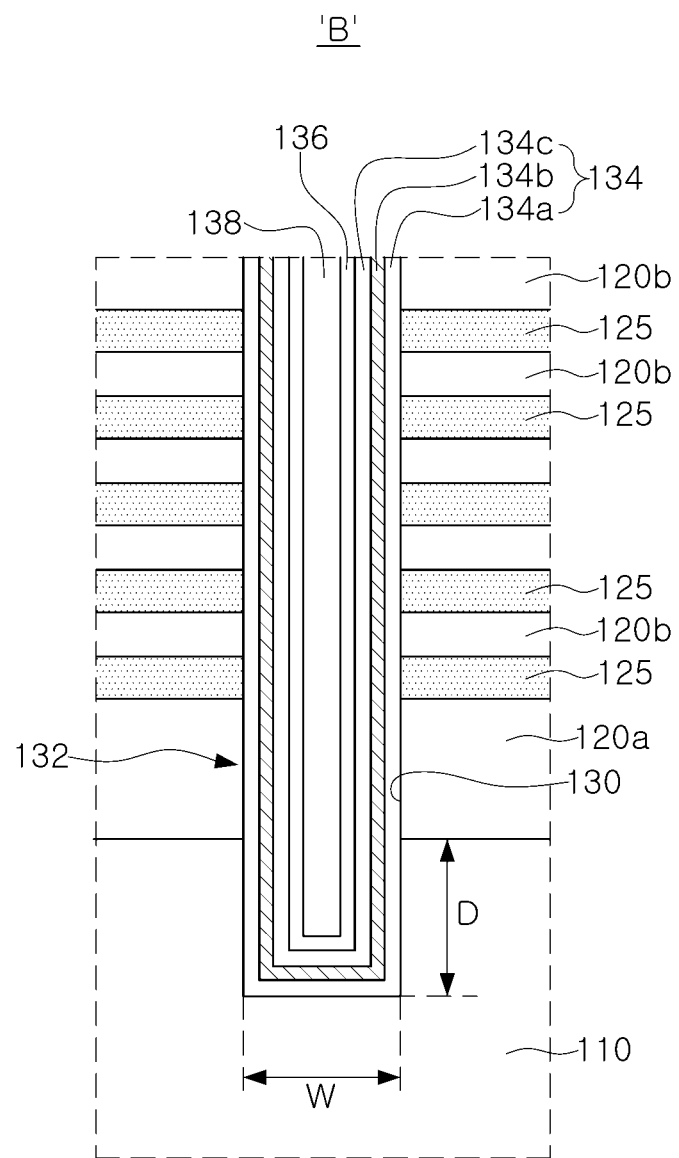

Referring to FIGS. 11A and 11B (which is an enlarged view of portion 13' of FIG. 11A), a lower insulating layer 120a may be formed on a sacrificial substrate 110. The sacrificial substrate 110 may be a semiconductor substrate. The lower insulating layer 120a may be formed of an insulating material such as silicon oxide or the like.

A plurality of sacrificial gate layers 125 and a plurality of interlayer insulating layers 120b that are alternately and repeatedly stacked on the lower insulating layer 120a may be formed.

In an example, the plurality of interlayer insulating layers 120b may be formed of silicon oxide.

The lower insulating layer 120a may have a thickness greater than a thickness of each of the plurality of interlayer insulating layers 120b.

In an example, the plurality of sacrificial gate layers 125 may be formed of an insulating material, for example, silicon nitride, having an etching property different from that of the plurality of interlayer insulating layers 120b.

In another example, the plurality of sacrificial gate layers 125 may be formed of a conductive material such as a doped silicon, a metal-semiconductor compound (e.g., a metal silicide or the like), a metal nitride (e.g., TiN, WN, or the like), a metal (e.g., Ti, W, or the like), or the like.

The plurality of sacrificial gate layers 125 and the plurality of interlayer insulating layers 120b may be patterned to form sacrificial pad regions 125p, arranged to have a stepped structure.

A first preliminary capping insulating layer 119a may be formed to cover the plurality of sacrificial gate layers 125 and the plurality of interlayer insulating layers 120b.

A channel hole 130 penetrating through the first preliminary capping insulating layer 119a, the plurality of sacrificial gate layers 125, and the plurality of interlayer insulating layers 120b and extending into the sacrificial substrate 110 may be formed.

In an example, a depth (D) of the channel hole 130 formed in the sacrificial substrate 110 may be substantially the same as a width (W) of the channel hole 130.

In another example, a depth (D) of the channel hole 130 formed in the sacrificial substrate 110 may be greater than a width (W) of the channel hole 130.

In another example, a depth (D) of the channel hole 130 formed in the sacrificial substrate 110 may be smaller than a width (W) of the channel hole 130.

A vertical structure 132 may be formed in the channel hole 130.

The vertical structure 132 may be formed as a plurality of vertical structures 132.

The formation of the vertical structure 132 may include forming a dielectric structure 134 covering an internal wall of the channel hole 130, forming a channel layer 136 covering the dielectric structure 134 in the channel hole 130, forming a core region 138 partially filling the channel hole 130, and forming a pad pattern 140 on the core region 138.

The formation of the dielectric structure 134 may include forming a first dielectric layer 134a, a data storage material layer 134b, and a second dielectric layer 134c in sequence.

The core region 138 may pass through the plurality of sacrificial gate layers 125 and extend into the sacrificial substrate 110. Therefore, the core region 138 may have a side surface facing the plurality of sacrificial gate layers 125.

In an example, the data storage material layer 134b may be a charge trap layer, such as silicon nitride. The data storage material layer 134b may include regions capable of storing data in a semiconductor device such as a vertical NAND flash memory device.

In an example, the core region 138 may be formed of an insulating material including voids. In another example, the core region 138 may be formed of an insulating material that does not include (i.e., is free of) voids.

The channel layer 136 may be formed of silicon. For example, the channel layer 136 may be formed of undoped silicon.

The pad pattern 140 may be formed of doped silicon. For example, the pad pattern 140 may be formed of doped polysilicon having N-type conductivity. The pad pattern 140 may be in contact with the channel layer 136. A portion of the channel layer 136 adjacent to the pad pattern 140 may have N-type conductivity.

Figure 12:
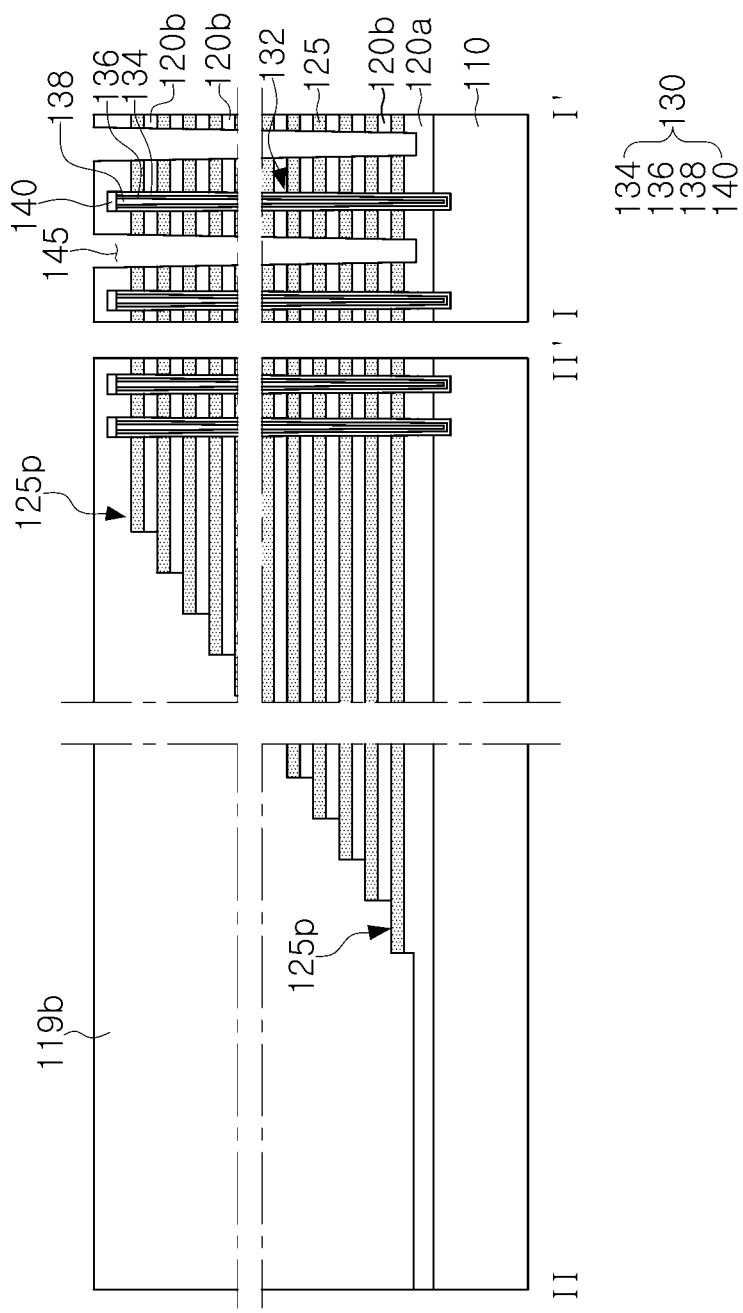

Referring to FIG. 12, a second preliminary capping insulating layer 119b having a thickness, greater than a thickness of the first preliminary capping insulating layer (119a of FIG. 11A), may be formed. The second preliminary capping insulating layer 119b may be formed by depositing an insulating layer on the first preliminary capping insulating layer (119a of FIG. 11A) to cover an upper surface thereof.

The second preliminary capping insulating layer 119b, the plurality of interlayer insulating layers 120b, and the plurality of sacrificial gate layers 125 may be patterned to form separation trenches 145 penetrating through at least the plurality of interlayer insulating layers 120b and the plurality of sacrificial gate layers 125.

The separation trenches 145 may expose side surfaces of the sacrificial gate layers 125.

In an example, the separation trenches 145 may extend into the lower insulating layer 120a and may be spaced apart from the sacrificial substrate 110.

In another example, the separation trenches 145 may pass through the lower insulating layer 120a and may expose the sacrificial substrate 110.

Figure 13:
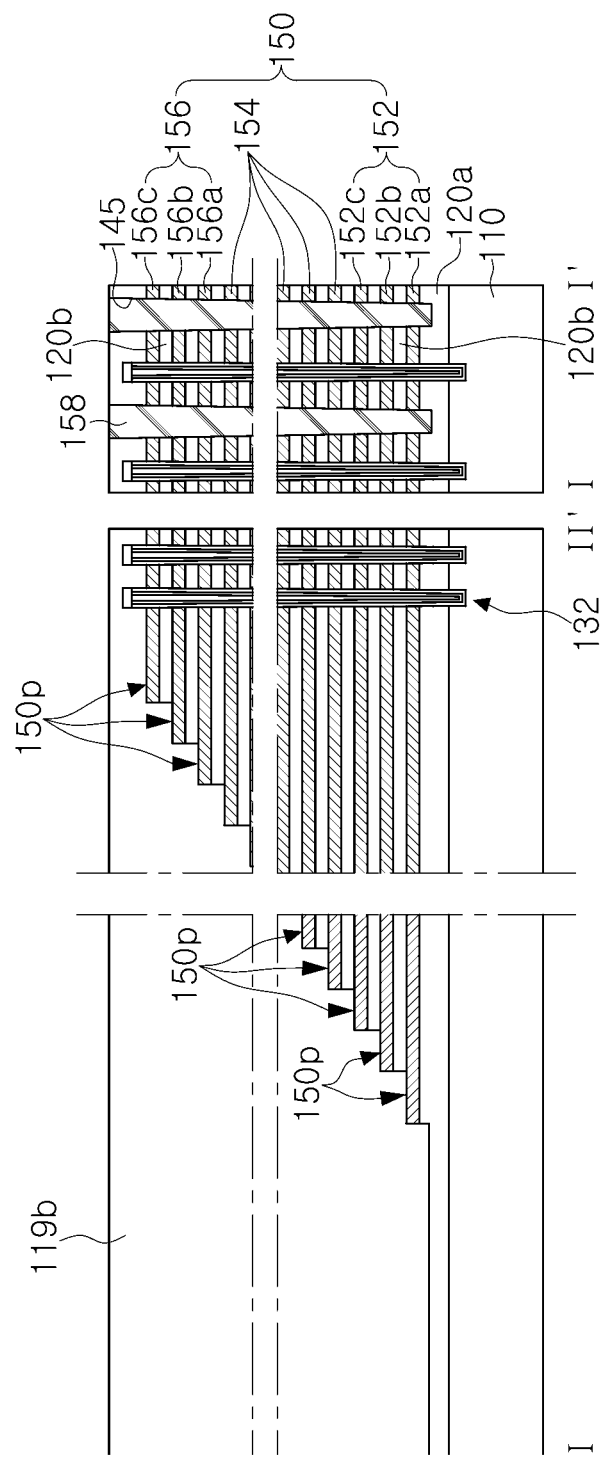

Referring to FIG. 13, in an example, when the plurality of sacrificial gate layers (125 of FIG. 12) are formed of an insulating material, the plurality of sacrificial gate layers (125 of FIG. 12) exposed by the separation trenches 145 may be replaced with a plurality of horizontal layers 150. For example, the plurality of sacrificial gate layers (125 of FIG. 12) may be removed, and the plurality of horizontal layers 150 may be formed in empty spaces in which the plurality of sacrificial gate layers (125 of FIG. 12) exposed by the separation trenches 145 were removed.

In an example, the plurality of horizontal layers 150 may include a conductive material.

In another example, when the plurality of sacrificial gate layers (125 of FIG. 12) are formed of a conductive material, the plurality of sacrificial gate layers (125 of FIG. 12) may not be removed. In this case, the plurality of sacrificial gate layers (125 of FIG. 12) may be referred to as a plurality of horizontal layers 150.

In an example, the plurality of horizontal layers 150 may include lower horizontal layers 152, intermediate horizontal layers 154 on the lower horizontal layers 152, and upper horizontal layers 156 on the intermediate horizontal layers 154. The lower horizontal layers 152 may include a first lower horizontal layer 152a, a second lower horizontal layer 152b, and a third lower horizontal layer 152c, sequentially stacked. The upper horizontal layers 156 may include a first upper horizontal layer 156a, a second upper horizontal layer 156b, and a third upper horizontal layer 156c, sequentially stacked.

Separation structures 158 may be formed to fill the separation trenches 145. The separation structures 158 may be formed of an insulating material such as silicon oxide or the like.

Figure 14:
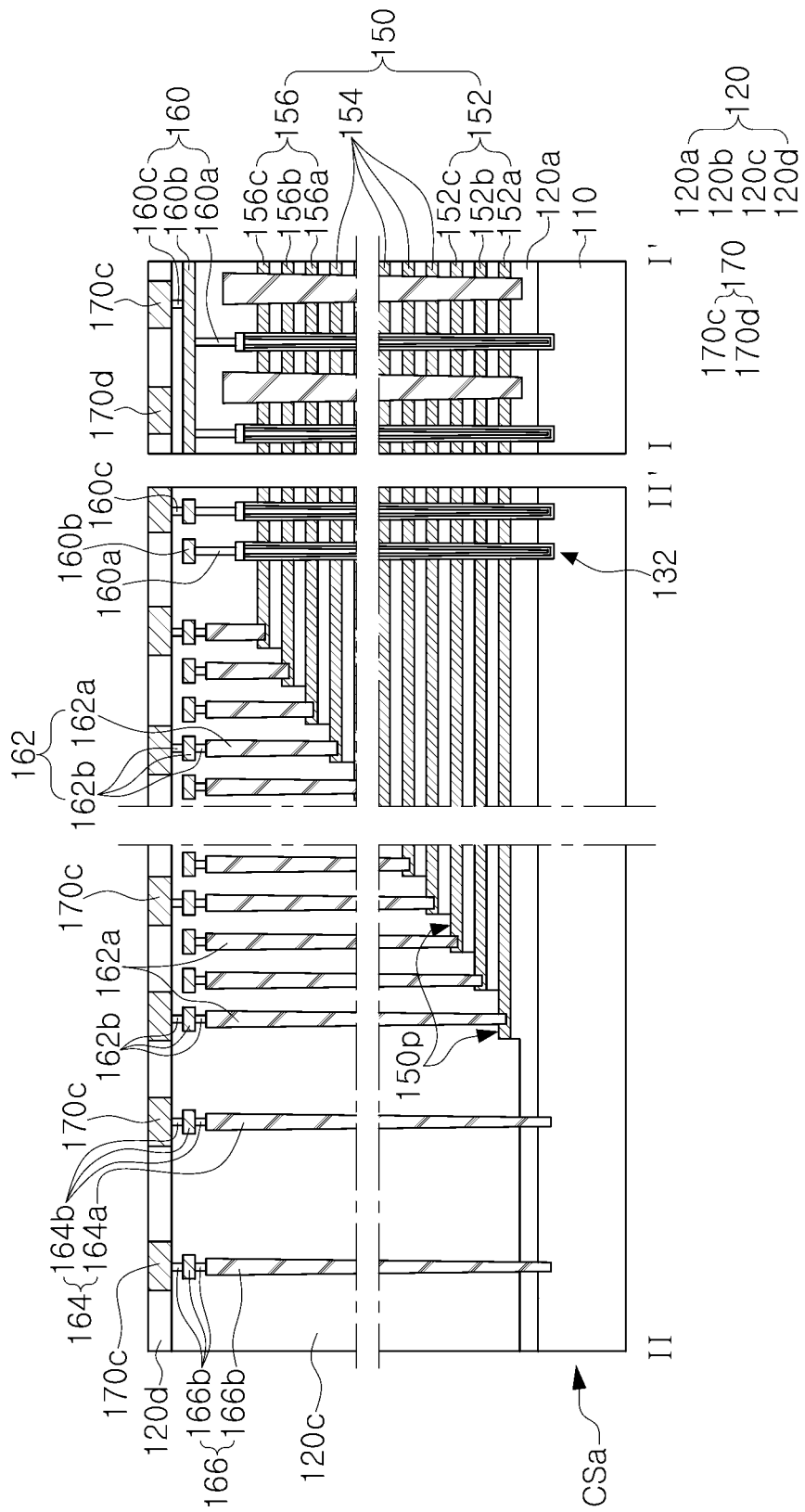

Referring to FIG. 14, a wiring process may be performed on the sacrificial substrate 110 having the second preliminary capping insulating layer (119b of FIG. 13), to form a capping insulating layer 120c having a thickness, greater than a thickness of the second preliminary capping insulating layer (119b of FIG. 13), and form wiring structures 160, 162, 164, and 166.

A second junction insulating layer 120d and second junction pads 170 may be formed on the capping insulating layer 120c and the wiring structures 160, 162, 164, and 166.

The second junction insulating layer 120d and the second junction pads 170 may have upper surfaces, coplanar with each other.

In an example, the second junction pads 170 may include second circuit junction pads 170c and a second dummy junction pad 170d.

The increase in thickness of the second preliminary capping insulating layer (119b of FIG. 13) to form the capping insulating layer 120c may include depositing insulating layers on the second preliminary capping insulating layer (119b of FIG. 13).

The lower insulating layer 120a, the plurality of interlayer insulating layers 120b, the capping insulating layer 120c, and the second junction insulating layer 120d may form a second insulating structure 120.

The wiring structures 160, 162, 164, and 166 may include a bitline structure 160, a gate wiring structure 162, a source wiring structure 164, and an input/output wiring structure 166.

In an example, the bitline structure 160 may include a bitline 160b, a first bitline connection pattern 160a electrically connecting the bitline 160b and the pad pattern 40 of the vertical structure 132, and a second bitline connection pattern 160c electrically connecting the bitline 160b and one of the second circuit junction pads 170c of the second junction pads 170. When the bitline 160b is provided as a plurality of bitlines 160b, the plurality of bitlines may be electrically connected to the plurality of second circuit junction pads 170c of the second junction pads 170, respectively.

In an example, the gate wiring structure 162 may include gate contact plugs 162a and gate connection patterns 162b. The gate contact plugs 162a may be in contact with pad regions 150p of the plurality of horizontal layers 150. The gate connection patterns 162b may be electrically connected to the gate contact plugs 162a and a portion of the second circuit junction pads 170c of the second junction pads 170.

In an example, the source wiring structure 164 may include a source contact plug 164a, and a source connection pattern 164b electrically connecting the source contact plug 164a and any one of the second circuit junction pads 170c of the second junction pads 170.

In an example, the input/output wiring structure 166 may include an input/output contact plug 166a, and an input/output connection pattern 166b electrically connecting the input/output contact plug 166a and any one of the second circuit junction pads 170c of the second junction pads 170.

Therefore, a preliminary chip structure CSa including the sacrificial substrate 110, the second insulating structure 120, the plurality of horizontal layers 150, the wiring structures 160, 162, 164, and 166, and the second junction pads 170 may be formed.

Figure 15:
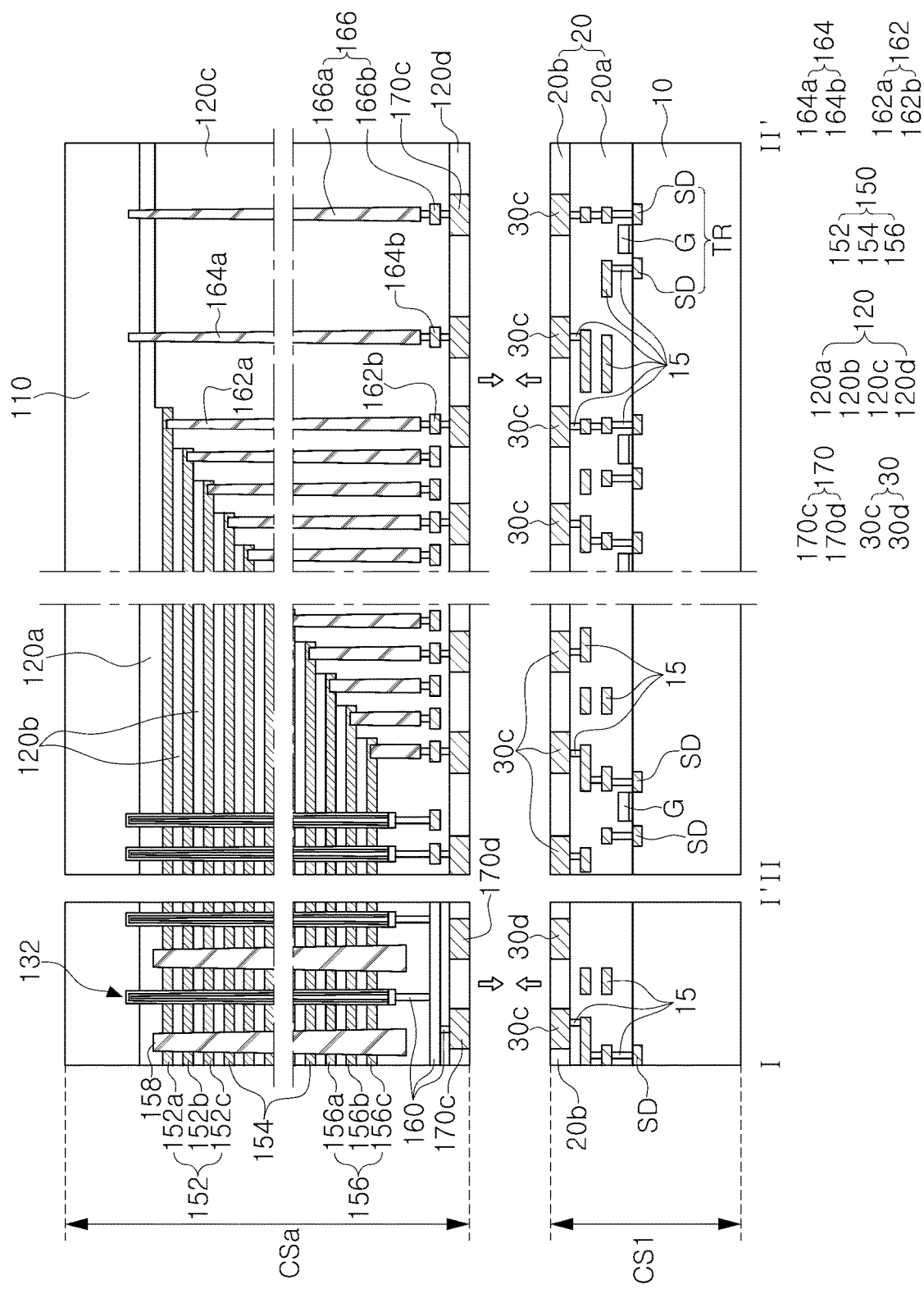

Referring to FIG. 15, a wafer bonding process may be performed to contact and join the second junction pads 170 of the preliminary chip structure CSa and the first junction pads 30 of the first chip structure CS1. In FIG. 15, arrows may indicate that the preliminary chip structure CSa and the first chip structure CS1 are in contact with each other while facing each other.

While the second junction pads 170 and the first junction pads 30 are joined to each other, the first junction insulating layer 20b and the second junction insulating layer 120d may be joined to each other while being in contact with each other. Therefore, the preliminary chip structure CSa and the first chip structure CS1 may be joined to each other to form a single structure.

Figure 16A:
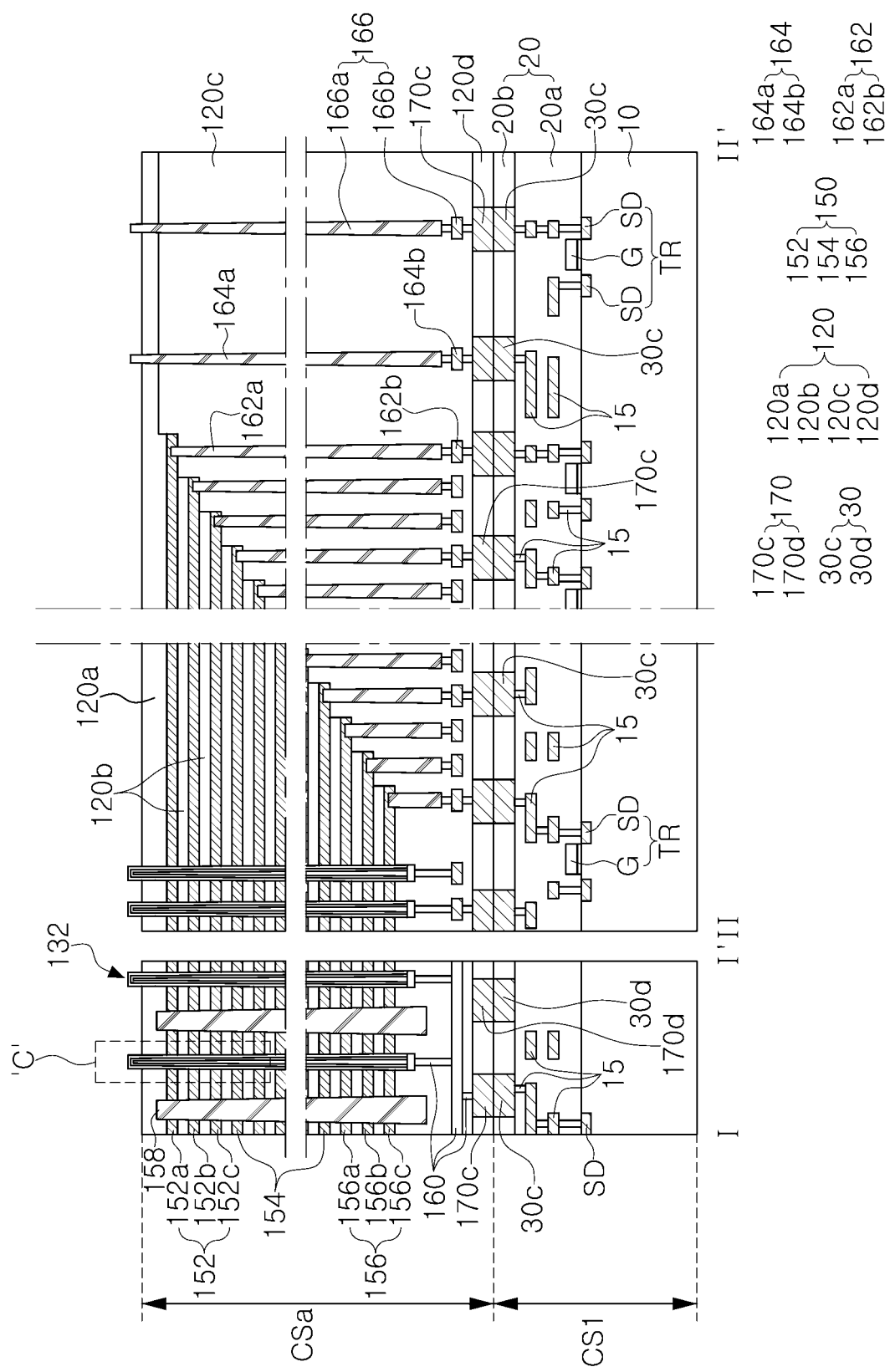
Figure 16B:
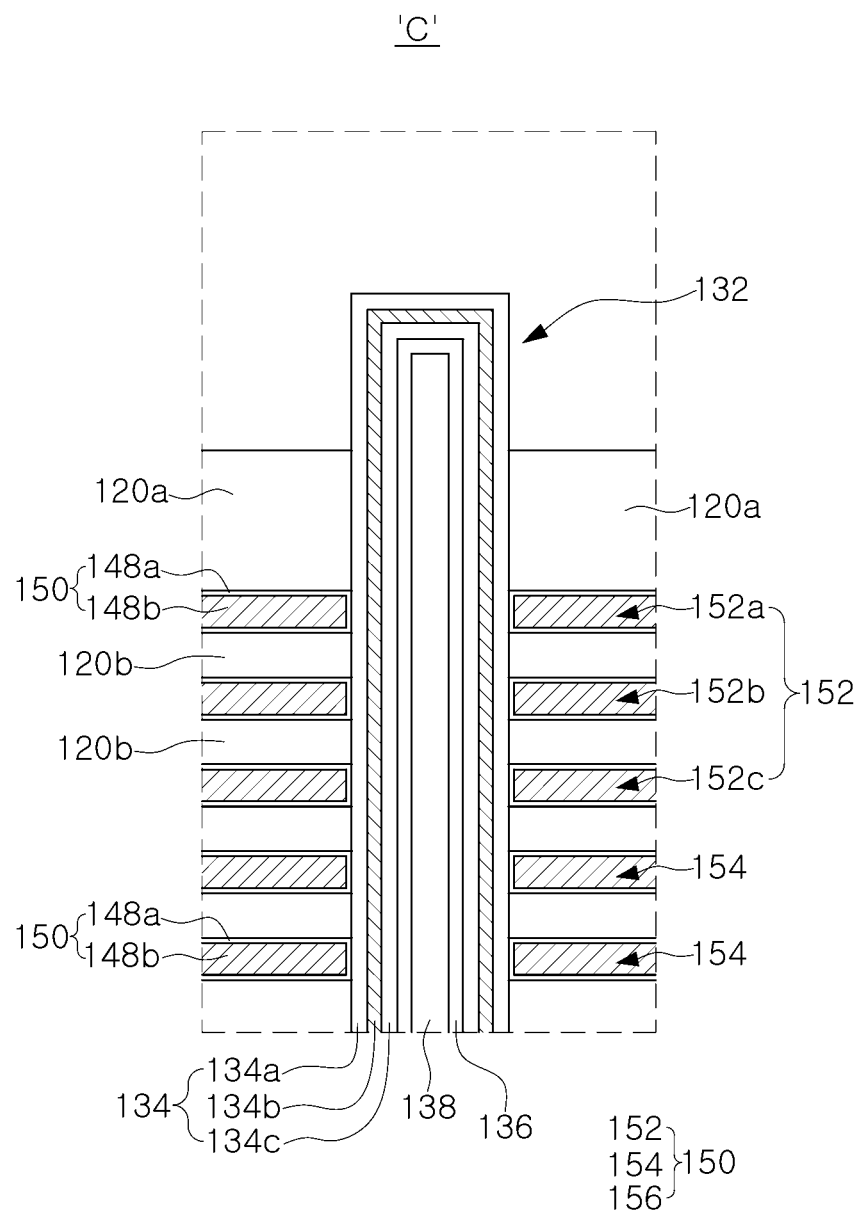

Referring to FIGS. 16A and 16B (which is an enlarged view of portion 'C' of FIG. 16A), the sacrificial substrate (110 of FIG. 15) of the preliminary chip structure CSa bonded to the first chip structure CS1 may be removed. As the sacrificial substrate 110 is removed, a portion of the vertical structure 132, a portion of the source contact plug 164a, and a portion of the input/output contact plug 166a are exposed to have protruding shapes.

The dielectric structure 134 of the vertical structure 132 may be exposed while removing the sacrificial substrate (110 of FIG. 15).

Figure 17:
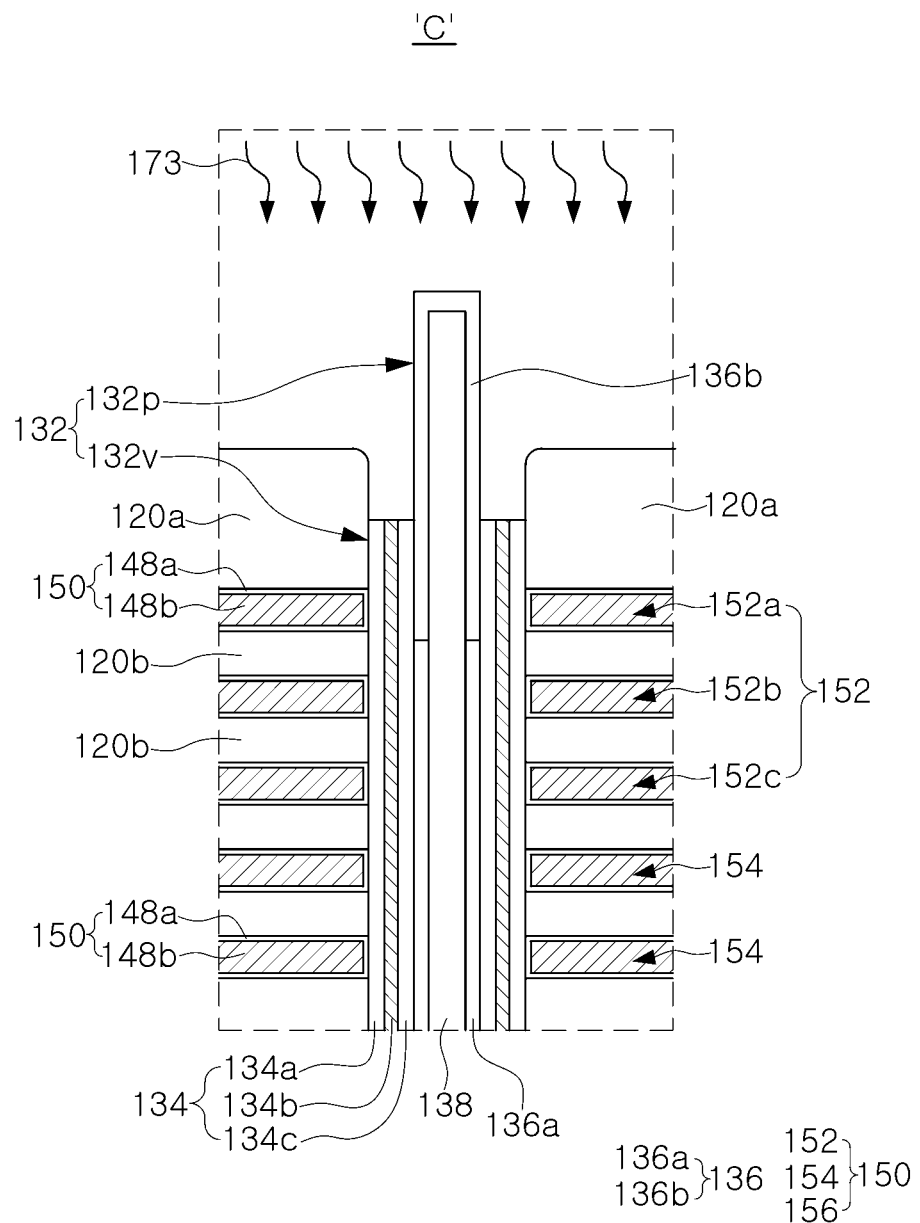

Referring to FIG. 17, the dielectric structure 134 of the vertical structure 132 may be etched while removing the sacrificial substrate (110 of FIG. 15). Further, a portion of the dielectric structure 134 located in the lower insulating layer 120a may be etched. Therefore, the vertical structure 132 may include a vertical portion 132v in which a portion of the dielectric structure 134 remains and a protruding portion 132p in which a portion of the dielectric structure 134 is etched and removed.

The channel layer 136 of the protruding portion 132p of the vertical structure 132 may be exposed.

An ion implantation operation 173 may be performed to implant impurities into the channel layer 136. Therefore, the channel layer 136 may include a doped portion 136b in which a portion of the impurities are implanted by the ion implantation operation 173, and an undoped portion 136a in which a portion of the impurities are not implanted by the ion implantation operation 173.

The ion implantation operation 173 may be a plasma ion implantation process or a gradient ion implantation process.

In an example, the doped portion 136b of the channel layer 136 may have N-type conductivity. When the channel layer 136 is formed of polysilicon, the undoped portion 136a may be formed of undoped polysilicon, and the doped portion 136b may be formed of doped polysilicon having N-type conductivity.

In another example, the ion implantation operation 173 may be omitted.

Figure 18:
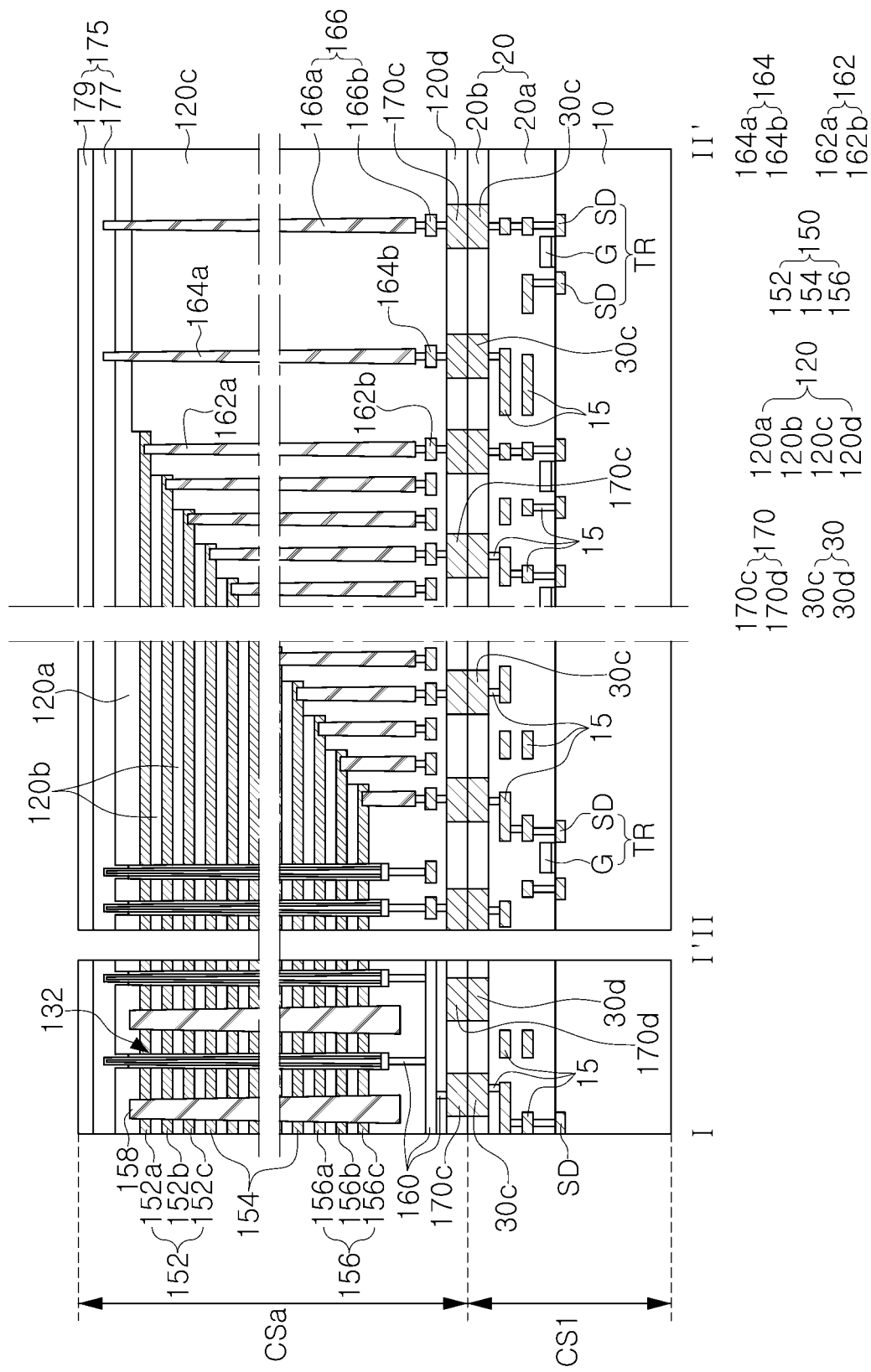

Referring to FIG. 18, a conductive material layer 175 covering the lower insulating layer 120a may be formed. The conductive material layer 175 may include a first material layer 177 and a second material layer 179 on the first material layer 177.

In an example, the first material layer 177 may be formed of doped polysilicon, and the second material layer 179 may be formed of a conductive material such as a metal-semiconductor compound (e.g., a metal silicide or the like), a metal nitride (e.g., TiN, WN, or the like) or a metal (e.g., Ti, W, Al, Cu, or the like).

Referring again to FIG. 3, the conductive material layer 175 of FIG. 18 may be patterned to form the conductive material pattern 175a and the conductive pad 175b. The conductive material pattern 175a may overlap the plurality of horizontal layers 150 and contact the source contact plug 164a. The conductive pad 175b may be in contact with the input/output contact plug 166a.

A cover insulating layer 185 disposed on the second insulating structure 120, covering the conductive material pattern 175a, and having an opening exposing at least a portion of the conductive pad 175b may be formed. An input/output pad 190 exposed by the cover insulating layer 185 may be formed on the conductive pad 175b. Therefore, a second chip structure CS2 may be formed on the first chip structure CS1.

According to the embodiments described above, the semiconductor device 1 including at least two chip structures CS1 and CS2 joined to each other may be provided. Among the two chip structures CS1 and CS2, the first chip structure CS1 may include a peripheral circuit PC, and the second chip structure CS2 may include a memory cell array region MCA. Since the peripheral circuit PC and the memory cell array region MCA may be arranged to overlap each other in the vertical direction, a planar area occupied by the peripheral circuit PC and the memory cell array region MCA may be reduced or minimized. Therefore, the semiconductor device 1 may be miniaturized.

In embodiments, since the first material layer 177a of the conductive material pattern 175a may be formed of a doped semiconductor material layer, for example, a polysilicon layer having N-type conductivity, an erase efficiency using the GIDL phenomenon of the vertical NAND flash memory device may be increased. Therefore, performance of the semiconductor device 1 may be improved.

According to embodiments of the present inventive concept, a semiconductor device capable of improving a degree of integration may be provided.

Various advantages and effects of the present inventive concept may be not limited to the above description, it will be more readily understood in the process of describing specific embodiments of the present inventive concept.

While examples have been illustrated and described above, it will be apparent to those skilled in the art that modified examples and variations could be made without departing from the scope of the present inventive concept as defined by the appended claims.

What is claimed is:
1. A semiconductor device comprising:
a first chip structure; and
a second chip structure, bonded to the first chip structure,
wherein the first chip structure comprises:
   a semiconductor substrate;
   a first insulating structure on the semiconductor substrate;
   a peripheral circuit in the first insulating structure; and
   first junction pads in the first insulating structure,
wherein the second chip structure comprises:
   a second insulating structure;
   a conductive material pattern on the second insulating structure;
   a plurality of horizontal layers vertically stacked and spaced apart from each other in the second insulating structure;
   a vertical structure comprising a vertical portion penetrating through the plurality of horizontal layers, and a protruding portion extending from the vertical portion into the conductive material pattern; and
   second junction pads in the second insulating structure,
wherein the first insulating structure and the second insulating structure are in contact with each other, and the first junction pads and the second junction pads are in contact with each other,
wherein the vertical structure comprises a channel layer extending from the vertical portion to the protruding portion, and a side surface of the channel layer in the protruding portion is in contact with the conductive material pattern.

2. The semiconductor device according to claim 1, wherein, in the vertical structure, a width of the vertical portion is greater than a width of the protruding portion.

3. The semiconductor device according to claim 1, wherein the vertical structure further comprises:

a core region that extends from the vertical portion of the vertical structure to the protruding portion of the vertical structure; and a dielectric structure comprising a data storage material layer in the vertical portion of the vertical structure, wherein the channel layer is between the dielectric structure and the core region in the vertical portion of the vertical structure and extends into the protruding portion of the vertical structure.

4. The semiconductor device according to claim 1, wherein the conductive material pattern comprises:

a first material layer; and a second material layer on the first material layer, wherein the first material layer comprises a doped semiconductor material, and the second material layer comprises a conductive material having lower resistivity than the doped semiconductor material.

5. The semiconductor device according to claim 4, wherein the first material layer comprises polysilicon having N-type conductivity.

6. The semiconductor device according to claim 4, wherein the first material layer comprises an N-type portion having N-type conductivity and a P-type portion having P-type conductivity, wherein the P-type portion is in contact with the protruding portion of the vertical structure, and the N-type portion is in contact with the second material layer.

7. The semiconductor device according to claim 4, wherein the conductive material pattern comprises:

a first portion overlapping the plurality of horizontal layers;

a second portion overlapping the protruding portion of the vertical structure; and a third portion between the first portion and the second portion, wherein, in the conductive material pattern, respective thicknesses of the first portion, the second portion, and the third portion are different from each other.

8. The semiconductor device according to claim 7, wherein the plurality of horizontal layers comprise a lower horizontal layer closest to the conductive material pattern, wherein a distance between the lower horizontal layer and the first portion is greater than a distance between the lower horizontal layer and the third portion.

9. The semiconductor device according to claim 1, wherein the second chip structure further comprises:

a source wiring structure in the second insulating structure and electrically connected to the conductive material pattern;

an input/output wiring structure in the second insulating structure;

a conductive pad on the input/output wiring structure and electrically connected to the input/output wiring structure; and an input/output pad on the conductive pad and electrically connected to the conductive pad.

10. The semiconductor device according to claim 9, wherein the conductive pad comprises a same material and a same thickness as the conductive material pattern, wherein an input/output contact plug of the input/output wiring structure extends from a portion in the second insulating structure into the conductive pad, and wherein the source wiring structure comprises a source contact plug in the second insulating structure and extending into the conductive material pattern.

11. The semiconductor device according to claim 9, wherein a side surface of the conductive pad is surrounded by the second insulating structure.

12. The semiconductor device according to claim 1, wherein the second chip structure further comprises:

a bitline structure in the second insulating structure and between the vertical structure and the second junction pads; and a gate wiring structure in the second insulating structure and between pad regions of the plurality of horizontal layers and the second junction pads, wherein respective lengths of the horizontal layers decrease with distance from the conductive material pattern such that the pad regions of the plurality of horizontal layers have a stepped shape.

* * * * *